(12) United States Patent
Kim et al.

(10) Patent No.: US 12,249,174 B2
(45) Date of Patent: Mar. 11, 2025

(54) DISPLAY DEVICE

(71) Applicant: Samsung Display Co., Ltd., Yongin-Si (KR)

(72) Inventors: Gee Bum Kim, Yongin-si (KR); Jae Ik Lim, Yongin-si (KR); Tae Hoon Yang, Yongin-si (KR); Dae Young Lee, Yongin-si (KR); Seong Min Cho, Yongin-si (KR); Beohm Rock Choi, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/536,168

(22) Filed: Nov. 29, 2021

(65) Prior Publication Data

US 2022/0309267 A1 Sep. 29, 2022

(30) Foreign Application Priority Data

Mar. 23, 2021 (KR) .................. 10-2021-0037544

(51) Int. Cl.
| | |
|---|---|
| G06K 9/00 | (2022.01) |
| G06V 40/13 | (2022.01) |
| H10K 50/86 | (2023.01) |
| H10K 59/122 | (2023.01) |
| H10K 59/38 | (2023.01) |
| H10K 59/65 | (2023.01) |
| H10F 39/12 | (2025.01) |

(52) U.S. Cl.
CPC ....... *G06V 40/1318* (2022.01); *H10K 50/865* (2023.02); *H10K 59/122* (2023.02); *H10K 59/38* (2023.02); *H10K 59/65* (2023.02); *H10F 39/198* (2025.01)

(58) Field of Classification Search
CPC .............. G06V 40/1318; H01L 27/322; H01L 27/3234; H01L 27/3246; H01L 51/5284; H01L 27/14678; H01L 31/12; H01L 51/5237
USPC ................................................................ 1/1
See application file for complete search history.

(56) References Cited

U.S. PATENT DOCUMENTS

| | | |
|---|---|---|
| 10,892,307 B2 | 1/2021 | Lee et al. |
| 11,741,739 B2 | 8/2023 | Sung et al. |

(Continued)

FOREIGN PATENT DOCUMENTS

| | | |
|---|---|---|
| KR | 10-2018-0051692 A | 5/2018 |
| KR | 10-2019-0079296 A | 7/2019 |

(Continued)

*Primary Examiner* — Abdul-Samad A Adediran
(74) *Attorney, Agent, or Firm* — Innovation Counsel LLP

(57) ABSTRACT

A display device may include a sensor layer, a substrate, a pixel layer, and a black matrix. The sensor layer may include photo sensors. The substrate may be positioned on the sensor layer. The pixel layer may be positioned on the substrate and may include pixels. The substrate may be positioned between the sensor layer and the pixel layer. The pixels may include pixel electrodes. The black matrix may be positioned on the pixel layer, may include first-set openings respectively overlapping with the pixel electrodes, and may include second-set openings not overlapping with any pixel electrodes of the display device in a direction perpendicular to the substrate. The pixel layer may be positioned between the substrate and the black matrix.

15 Claims, 19 Drawing Sheets

(56) References Cited

U.S. PATENT DOCUMENTS

| | | | | |
|---|---|---|---|---|
| 2016/0266695 | A1* | 9/2016 | Bae | G06V 40/1318 |
| 2017/0278900 | A1* | 9/2017 | Yang | G06F 1/1652 |
| 2019/0213379 | A1* | 7/2019 | Zhao | G06V 40/1318 |
| 2020/0104562 | A1* | 4/2020 | Sung | H01L 31/12 |
| 2020/0184178 | A1* | 6/2020 | Zhou | H01L 51/5237 |

FOREIGN PATENT DOCUMENTS

| | | |
|---|---|---|
| KR | 10-2019-0080312 A | 7/2019 |
| KR | 10-2020-0038388 A | 4/2020 |

* cited by examiner

DISPLAY DEVICE

CROSS-REFERENCE TO RELATED APPLICATION

This application claims priority to and the benefit of Korean Patent Application No. 10-2021-0037544, filed on Mar. 23, 2021; the Korean Patent Application is incorporated by reference.

BACKGROUND

1. Field

The technical field generally relates to a display device.

2. Discussion of the Related Art

Display devices, such as smartphones and tablet PCs, may display images in response to user inputs. A display device may perform biometric information authentication using a fingerprint of a user. In order for a display device to perform fingerprint sensing, a fingerprint sensor may be built in or attached to the display device.

A photosensitive type fingerprint sensor may comprise a light source and a photo sensor. The photo sensor may acquire fingerprint information by receiving light reflected by a finger of a user.

SUMMARY

Embodiments may be related to a display device comprising a photosensitive type fingerprint sensor. In the display device, degradation of luminance due to reflection of external light can be prevented. The thickness of the display panel may be minimized.

In accordance with embodiments, a display device may include the following elements: a sensor layer comprising photo sensors; a substrate on the sensor layer, the substrate having a sensing area comprising a first area and a second area; a pixel layer on the substrate, the pixel layer comprising at least one pixel overlapping the first area on the first area; and an anti-reflection layer on the pixel layer, the anti-reflection layer comprising a black matrix, wherein the black matrix comprises a first opening overlapping with the first area and a second opening overlapping with the second area.

The at least one pixel may comprise a first pixel and a second pixel, which emit first color light, a third pixel emitting second color light, and a fourth pixel emitting third color light. The first area may comprise a first sub-area overlapping with the first pixel, a second sub-area overlapping with the second pixel, a third sub-area overlapping with the third pixel, and a fourth sub-area overlapping with the fourth pixel. The first to fourth sub-areas may be spaced apart from each other.

The first opening may comprise a first sub-opening overlapping with the first sub-area, a second sub-opening overlapping with the second sub-area, a third sub-opening overlapping with the third sub-area, and a fourth sub-opening overlapping with the fourth sub-area. The first sub-opening, the second sub-opening, and the second opening may be integrally formed.

The anti-reflection layer may further comprise a color filter on the black matrix.

The color filter may comprise a first color filter overlapping with the first pixel and the second pixel, a second color filter overlapping with the third pixel, and a third color filter overlapping with the fourth pixel.

The first color filter may overlap with the first sub-area, the second sub-area, and the second area.

Light generated from the at least one pixel may be emitted to the outside through the first opening. Light incident from the outside may be provided to the sensor layer through the second opening.

The pixel layer may comprise: a circuit element layer comprising at least one transistor overlapping with the first area and an insulating layer covering the at least one transistor; and a light emitting element layer on the circuit element layer, the light emitting element layer comprising an emitting layer overlapping with the first area.

The light emitting element layer may further comprise a bank layer is on the circuit element layer while surrounding the emitting layer, to define the first area.

The bank layer may comprise: a third opening overlapping with the first opening; and a fourth opening overlapping with the second opening, the fourth opening exposing a portion of the insulating layer.

The third opening may comprise a fifth sub-opening overlapping with the first sub-area, a sixth sub-opening overlapping with the second sub-area, a seventh sub-opening overlapping with the third sub-area, and an eighth sub-opening overlapping with the fourth sub-area. The fifth sub-opening, the sixth sub-opening, and the second opening may be integrally formed.

The bank layer may overlap with the black matrix.

The bank layer and the black matrix may comprise the same material.

The display device may further comprise a light blocking layer between the substrate and the pixel layer, the light blocking layer comprising a plurality of pinholes.

The light blocking layer may block some of lights incident from the outside, and provide the others to the sensor layer through the pinholes.

The circuit element layer may comprise an array layer on the sensing area, the array layer comprising a plurality of light transmission holes overlapping with the second area.

The array layer may block some of lights incident from the outside, and provide the others to the sensor layer through the light transmission holes.

The first color light may correspond to green light, the second color light may correspond to red light, and the third color light may correspond to blue light.

The photo sensors may sense light which is emitted from the at least one pixel and then reflected by a finger of a user, thereby sensing a fingerprint of the user.

In accordance with embodiments, a display device may include the following elements: a sensor layer comprising photo sensors; a substrate on the sensor layer, the substrate having a sensing area comprising a first area and a second area; a circuit element layer on the substrate, the circuit element layer comprising at least one transistor overlapping with the first area on the first area and an insulating layer covering the at least one transistor; and a light emitting element layer comprising an emitting layer on the circuit element layer, the emitting layer overlapping with the first area, and a bank layer while surrounding the emitting layer, to define the first area, wherein the bank layer comprises a third opening overlapping with the first area and a fourth opening overlapping with the second area. An embodiment may be related to a display device. The display device may include a sensor layer, a substrate, a pixel layer, and a black matrix. The sensor layer may include photo sensors. The substrate may be positioned on the sensor layer. The pixel layer may be positioned on the substrate and may include pixels. The substrate may be positioned between the sensor layer and the pixel layer. The pixels may include pixel electrodes. The black matrix may be positioned on the pixel layer, may include first-set openings respectively overlapping with the pixel electrodes, and may include second-set openings not overlapping with any pixel electrodes of the display device in a direction perpendicular to the substrate. The pixel layer may be positioned between the substrate and the black matrix.

The pixels may include a first pixel and a second pixel each emitting first color light, a third pixel emitting second color light, and a fourth pixel emitting third color light. The first-set openings may include a first first-set opening overlapping with the first pixel, a second first-set opening overlapping with the second pixel, a third first-set opening overlapping with the third pixel, and a fourth first-set opening overlapping with the fourth pixel. At least two of the first first-set opening, the second first-set opening, the third first-set opening, and the fourth first-set opening may be spaced from each other.

The first first-set opening and the second first-set opening may be directly connected to one of the second-set openings.

The display device may include a color filter set positioned on the black matrix.

The color filter set may include a first color filter overlapping the first pixel and the second pixel, a second color filter overlapping the third pixel, and a third color filter overlapping the fourth pixel.

The first color filter may overlap with each of the first first-set opening, the second first-set opening, and one of the second-set openings.

Light generated from the pixels may be transmitted beyond the display device through the first-set openings. Light incident into the display device may be provided to the sensor layer through the second-set openings.

The pixel layer may include the following elements: a circuit element layer including transistors that respectively overlap with the first-set openings and including an insulating layer that covers the transistors; and a light emitting element layer positioned on the circuit element layer and including emitting layers that respectively overlap with the first-set openings.

The light emitting element layer may include a bank layer positioned on the circuit element layer and surrounding the emitting layers.

The bank layer may include the following structures: third-set openings respectively overlapping with the first-set openings; and fourth-set openings respectively overlapping with the second-set openings and respectively exposing portions of the insulating layer.

The third-set openings may include a first third-set opening overlapping with the first first-set opening, a second third-set opening overlapping with the second first-set opening, a third third-set opening overlapping with the third first-set opening, and a fourth third set opening overlapping with the fourth first-set opening. One of the fourth-set openings may be positioned between the first third-set opening and the second third-set opening.

The bank layer may overlap the black matrix.

A material of the bank layer may be identical to a material of the black matrix.

The display device may include a light blocking layer positioned between the substrate and the pixel layer and including through holes.

The light blocking layer may block a first portion of light. The through holes may transmit a second portion of the light toward the sensor layer.

The circuit element layer may include light transmission holes that respectively overlap with the second-set openings.

The circuit element layer may block a first portion of light. The light transmission holes may transmit a second portion of the light toward the sensor layer.

The display device may include a light blocking layer positioned between the substrate and the pixel layer and including through holes that respectively overlap with the light transmission holes.

The light may be emitted from the pixels and then reflected by a finger of a user.

An embodiment may be related to a display device. The display device may include the following elements: a sensor layer including photo sensors; a substrate positioned on the sensor layer; a circuit element layer positioned on the substrate, including transistors, and including an insulating layer covering the transistors; and a light emitting element layer including emitting layers and a bank layer. The emitting layers may respectively correspond to the transistors. The bank layer may include first-set openings and second-set openings. The first-set openings may respectively accommodate the emitting layers. The second-set openings may accommodate no emitting layers.

DETAILED DESCRIPTION

Figure 1:
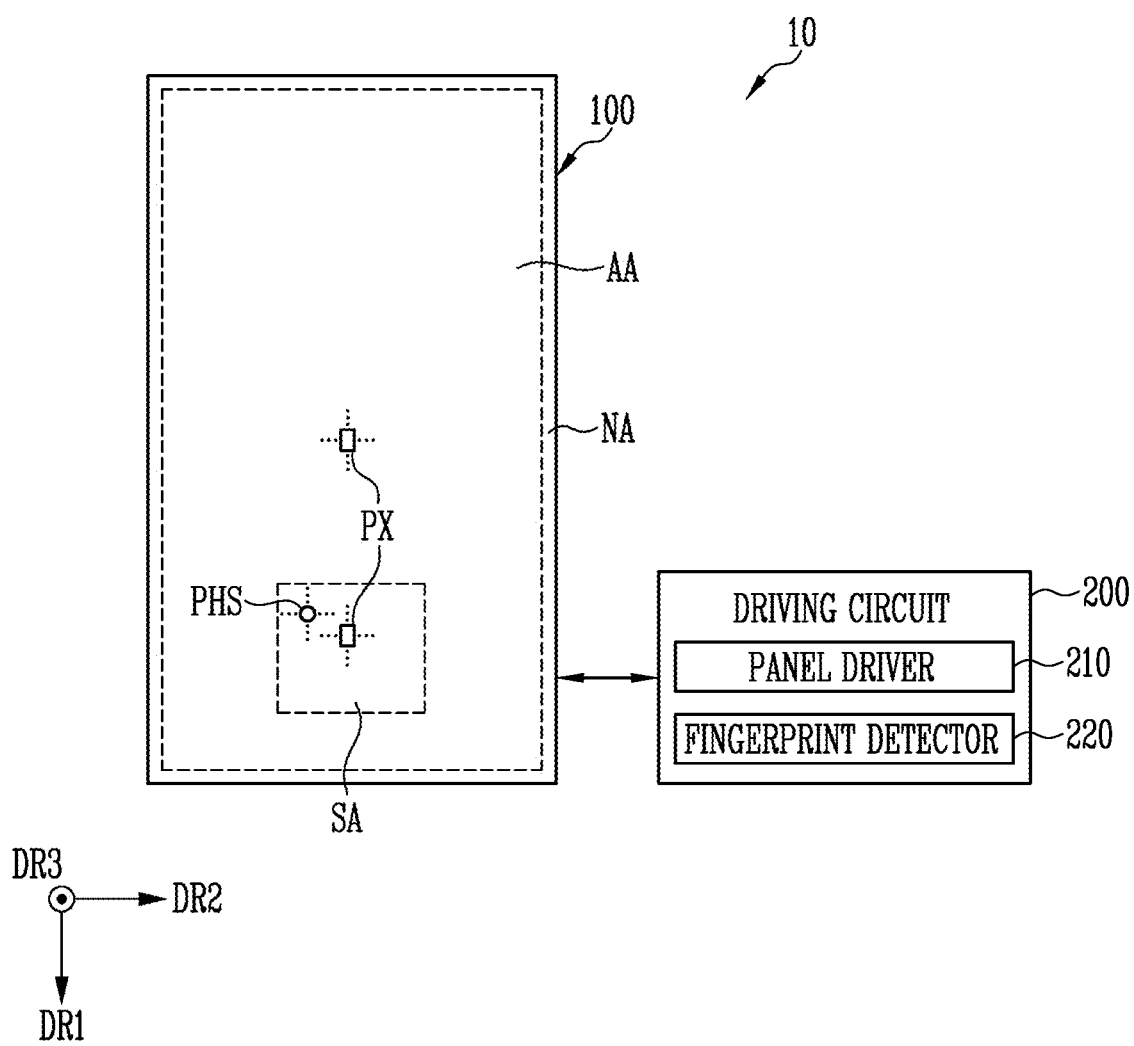
FIG. 1 shows a plan view and/or a block diagram schematically illustrating a display device in accordance with embodiments.

Example embodiments are described with reference to the drawings. Various changes, equivalent materials, and replacements are applicable to practical embodiments. The drawings are illustrative, and dimensions in the drawings may be exaggerated for better understanding.

Like numbers may refer to like elements.

Although the terms "first," "second," etc. may be used to describe various elements, these elements should not be limited by these terms. These terms may be used to distinguish one element from another element. A "first" element may be termed a "second" element without departing from embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

Singular forms may indicate plural forms as well, unless the context clearly indicates otherwise.

The terms "includes" and/or "including" may specify the presence of stated features, integers, steps, operations, elements, components, etc., but may not preclude the presence and/or addition of one or more other features, integers, steps, operations, elements, components, etc.

When a first element is referred to as being "connected" or "coupled" to a second element, the first element can be directly connected or coupled to the second element or may be indirectly connected or coupled to the second element through one or more intervening elements.

The term "connected" may mean "electrically connected" or "electrically connected through no intervening transistor." The term "insulate" may mean "electrically insulate" or "electrically isolate."The term "conductive" may mean "electrically conductive." The term "drive" may mean "operate" or "control." The term "include" may mean "be made of." The term "on" may mean "directly on" or "indirectly on." The term "overlap with" may mean "be co-located with" or "share a same position with." That a hole overlaps an element may mean that the position of the hole overlaps (with) the element and/or that the hole exposes the element.

Figure 2:
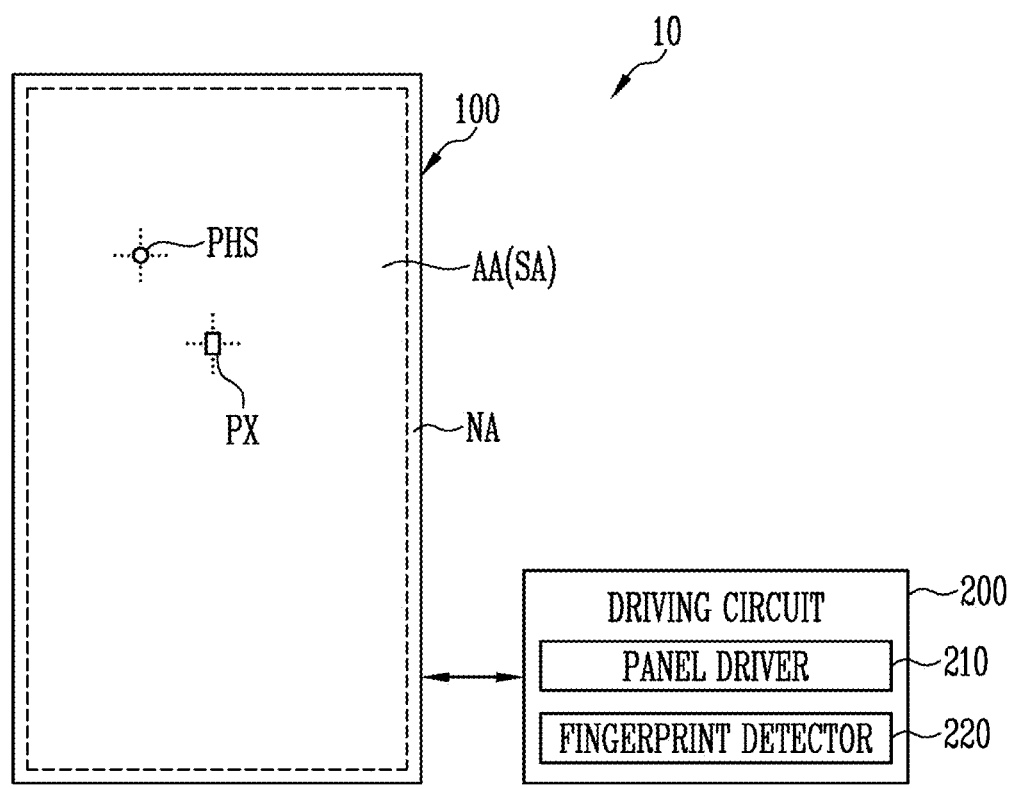
FIG. 2 shows a plan view and/or a block diagram schematically illustrating a display device in accordance with embodiments.
Figure 2:
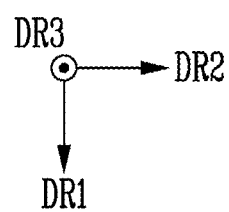

Each of FIGS. 1 and 2 schematically illustrates a display device 10 in accordance with embodiments. In each of FIGS. 1 and 2, the display device 10 includes display panel 100 and a driving circuit 200 for driving the display panel 100. The display panel 100 and the driving circuit 200 may be separate from each other. The whole or a portion of the driving circuit 200 may be integrally implemented on the display panel 100.

The display panel 100 includes a display area AA and a non-display area NA. The display area AA may include pixels PX and may be referred to as an active area. Each of the pixels PX may include at least one light emitting element. The display device 10 drives the pixels PX, according to image data input (e.g., from an external source), thereby displaying an image in the display area AA. The display area AA may be on or parallel to a plane defined by a first direction axis (i.e., an axis extending in a first direction DR1) and a second direction axis (i.e., an axis extending in a second direction DR2). A normal direction of a display surface of the display device 10, i.e., a thickness direction of the display device 10, may be a third direction DR3.

A front surface (or top surface) and a back surface (or bottom surface) of each member or unit of the display device 10 may be opposite each other in the third direction DR3. The directions DR1, DR2, and DR3 may or may not be orthogonal.

The display area AA may include a sensing area SA. The sensing area SA may include at least some pixels PX among the pixels PX provided in the display area AA.

As shown in FIG. 1, a portion of the display area AA may be set as the sensing area SA. As shown in FIG. 2, the whole of the display area AA may be set as the sensing area SA.

One or more sensing areas SA may be formed in the display area AA. For example, sensing areas SA may be arranged regularly or irregularly in the display area AA. The sensing areas SA may have sizes and/or shapes that are equal/identical to or different from each other.

The sensing area SA may be within the display area AA. The display area AA and the sensing area SA may partially overlap with each other.

The non-display area NA is disposed at the periphery of the display area AA and may be referred to as a non-active area. The non-display area may include all areas of the display panel 100 except the display area AA.

The non-display area NA may include a line area, a pad area, various dummy areas, and the like.

The display device 10 may further include a plurality of photo sensors PHS provided in the sensing area SA. The photo sensors PHS may sense light emitted from a light source and reflected by a finger of a user, and may sense a fingerprint of the user by analyzing the reflected light. Additionally or alternatively, the photo sensors PHS may function as a touch sensor or a scanner.

The photo sensors PHS may be disposed on/in the sensing area SA. The photo sensors PHS may overlap with at least some or all of the pixels PX provided on the sensing area SA, or may neighbor the pixels PX. For example, at least some or all of the photo sensors PHS may be provided between the pixels PX.

When the photo sensors PHS are disposed adjacent to the pixels PX, the photo sensors PHS may use light emitted from a light emitting element provided in at least one pixel PX disposed in/near the sensing area SA. The photo sensors PHS along with (the light emitting elements of) the pixels PX of the sensing area SA, particularly may constitute a photosensitive type fingerprint sensor. Without any extra light source, the module thickness and manufacturing cost of the photosensitive type fingerprint sensor and the display device 10 can be minimized.

The photo sensors PHS may be arranged on a non-display surface (e.g., a rear surface) opposite the display surface (e.g., a front surface) on which an image is displayed and may be positioned between opposite surfaces of the display panel 100. The photo sensors PHS may be arranged on the display surface on which the image is displayed and may be positioned between opposite surfaces of the display panel 100.

The driving circuit 200 may drive the display panel 100. The driving circuit 200 may output a data signal (corresponding to image data) to the display panel 100, and/or may output a driving signal for the photo sensor PHS and receive a sensing signal from the photo sensor PHS. The driving circuit 200 may detect a fingerprint shape of the user by using the sensing signal.

The driving circuit 200 may include a panel driver 210 and a fingerprint detector 220. The panel driver 210 and the fingerprint detector 220 may be separate from each other. At least a portion of the fingerprint detector 220 may be integrated with the panel driver 210 or operate in connection with the panel driver 210.

The panel driver 210 may supply a data signal (corresponding to image data) to the pixels PXL of the display area AA while sequentially scanning the pixels PXL. Accordingly, the display panel 100 may display an image corresponding to the image data.

The panel driver 210 may supply a driving signal (for fingerprint sensing) to the pixels PXL. The driving signal may allow the pixels PXL to operate as light sources for the photo sensors PHS by emitting lights. The driving signal for fingerprint sensing may be provided to pixels PXL provided in a specific area of the display panel 100, e.g., the pixels PXL provided in the sensing area SA.

The driving signal for fingerprint sensing may be provided by the fingerprint detector 220. The fingerprint detector 220 may provide a driving signal to the photo sensors PHS for driving the photo sensors PHS, and may detect a fingerprint of the user based on a sensing signal received from the photo sensors PHS.

Each of FIGS. 3A to 3E shows a plan view illustrating pixels and photo sensors in sensing area of a display device in accordance with embodiments. FIGS. 3A to 3E illustrate different relative sizes, resolutions, and relative positions of at least one pixel PX and at least one photo sensor PHS in the sensing area SA.

Figure 3A:
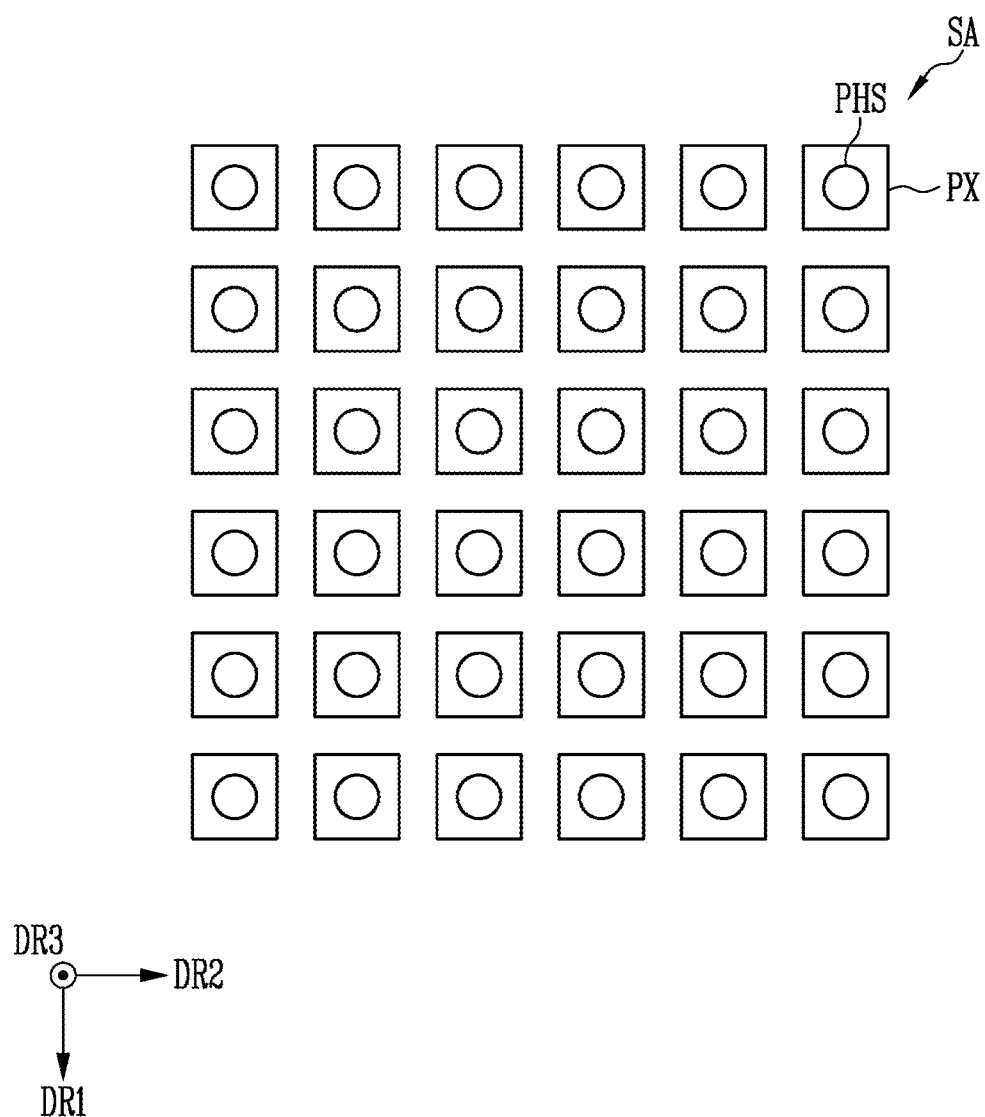
FIG. 3A is a plan view illustrating pixels and photo sensors in a display device in accordance with embodiments.

Referring to FIG. 3A, photo sensors PHS may be arranged at a resolution (density) equal to that of pixels PX in the sensing area SA. The number of the photo sensors PHS may be equal to that of the pixels PX in the sensing area SA. The pixels PX and the photo sensors PHS may form pairs. Each pixel PX may correspond to one photo sensor PHS. As shown in FIG. 3A, the pixels PX and the photo sensors PHS may overlap with each other. The pixels PX and the photo sensors PHS may not overlap with each other, or only some may overlap with each other in only part of the sensing area.

in a plan view of the display device, one photo sensor PHS may be smaller than, of the same size as, or larger than one pixel PX.

Referring to FIGS. 3B to 3E, photo sensors PHS may be arranged at a resolution/density lower than that of pixels PX in the sensing area SA. There may be fewer photo sensors PHS than pixels PX in the sensing area SA. In the sensing area SA, the ratio of photo sensors PHS to pixels PX may be 1 to two or more, such as 1 to 4 illustrated in FIGS. 3B to 3E.

Figure 3B:
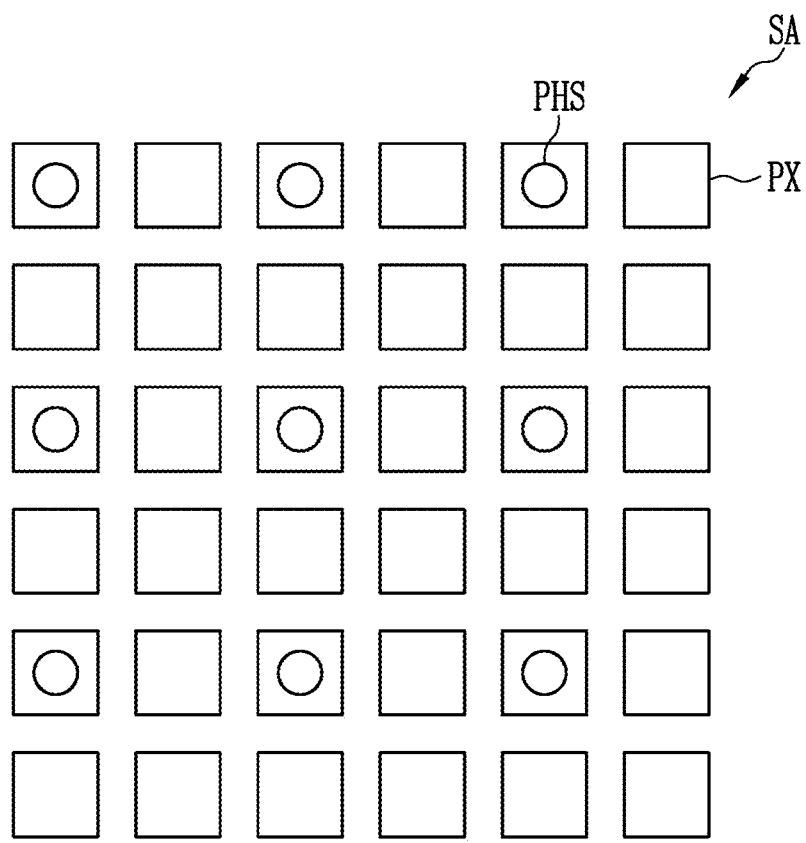
FIG. 3B is a plan view illustrating pixels and photo sensors in a display device in accordance with embodiments.
Figure 3B:
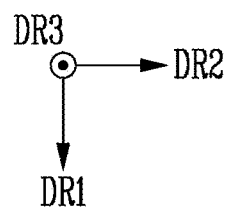
Figure 3C:
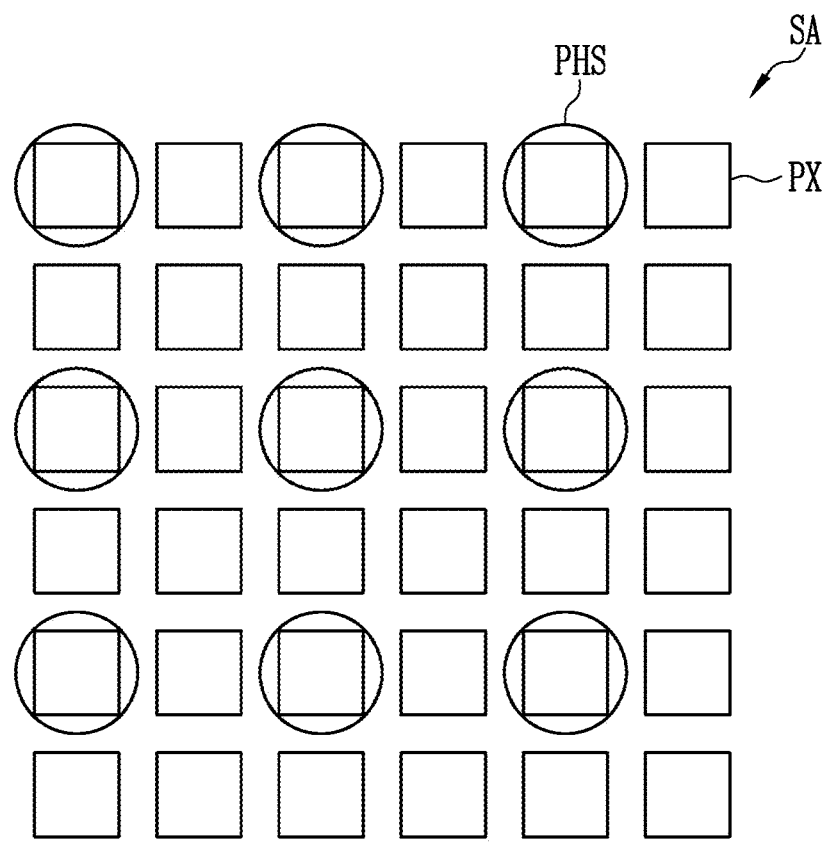
FIG. 3C is a plan view illustrating pixels and photo sensors in a display device in accordance with embodiments.
Figure 3C:
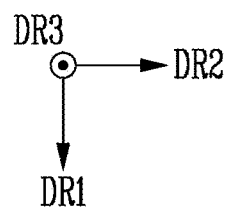

Some or all of the photo sensors PHS may respectively overlap with some of the pixels PX. The photo sensors PHS may partially/completely overlap with some (but not all) of the pixels PX, as shown in FIGS. 3B and 3C.

Figure 3D:
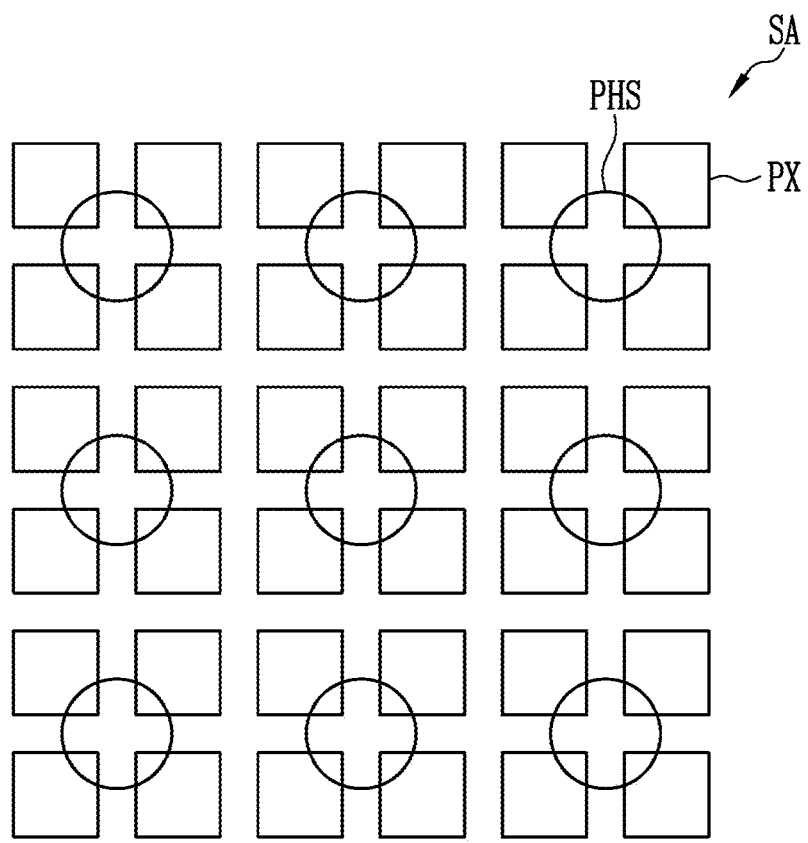
FIG. 3D is a plan view illustrating pixels and photo sensors in a display device in accordance with embodiments.
Figure 3D:
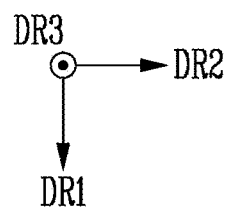

A photo sensor PHS may partially overlap multiple pixels PX, as shown in FIG. 3D.

Figure 3E:
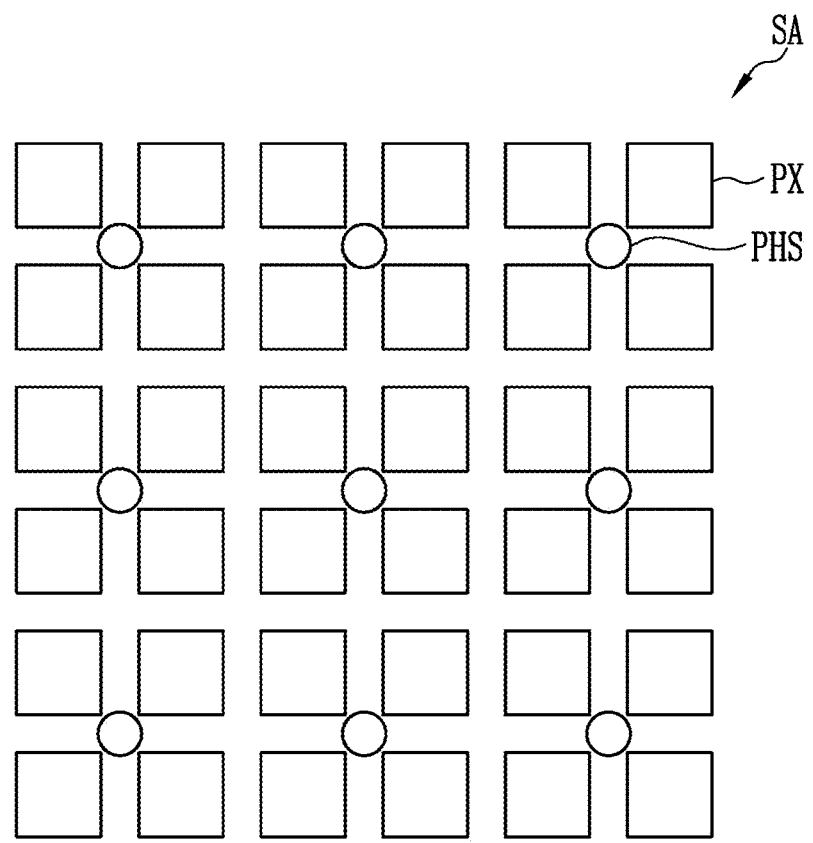
FIG. 3E is a plan view illustrating pixels and photo sensors in a display device in accordance with embodiments.
Figure 3E:
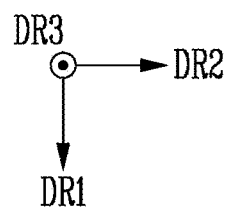

The photo sensors PHS may be positioned between the pixels PX and may not overlap with the pixels PX, as shown in FIG. 3E.

The shapes, arrangements, relative sizes, numbers, and resolutions/densities of the pixels PX and the photo sensors PHS in the sensing area SA may be configured according to embodiments. For example, unlike the embodiments shown in FIGS. 3A to 3E, the photo sensors PHS may be arranged at a resolution (density) greater than that of the pixels PX in the sensing area SA. There may be more photo sensors PHS than pixels PX in the sensing area SA.

Some structures shown in some of FIGS. 3A to 3E may be combined.

Photo sensors PHS may be regularly or irregularly arranged in the sensing area SA.

Figure 4:
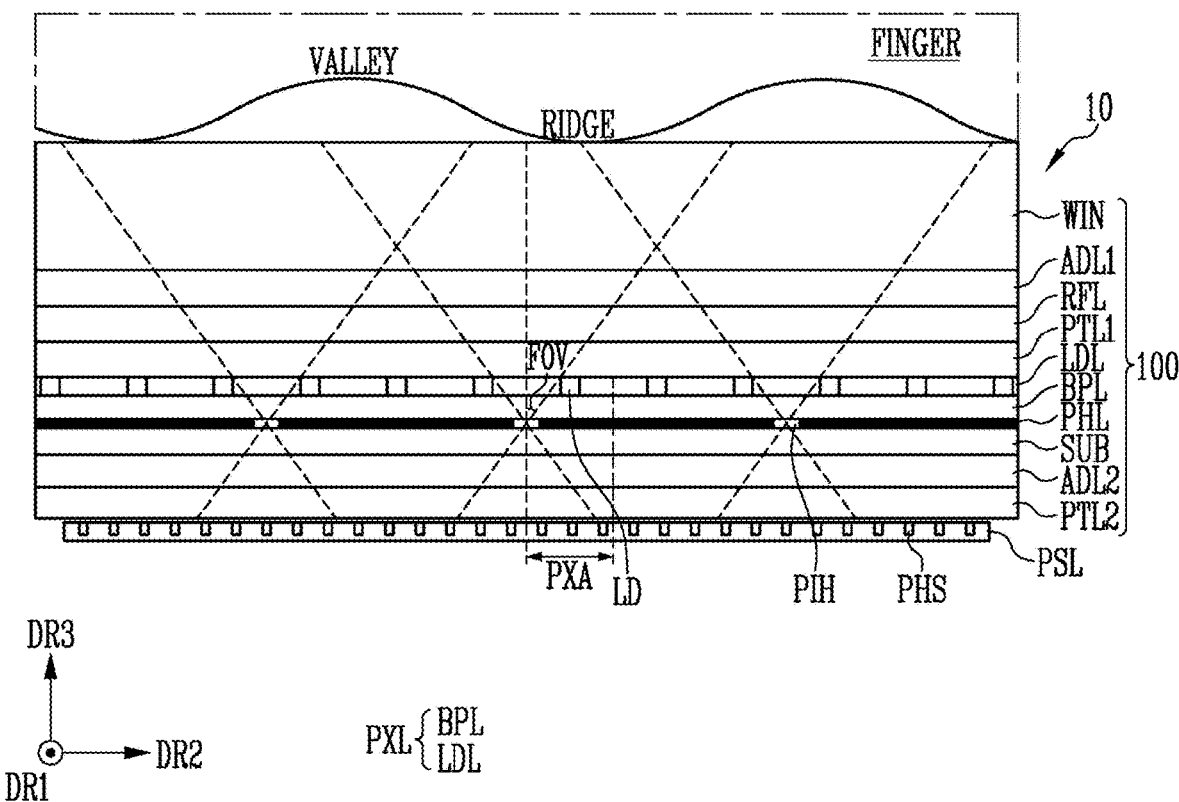
FIG. 4 is a schematic cross-sectional view of a display device in accordance with embodiments.

FIG. 4 is a schematic cross-sectional view of a display device in accordance with embodiments. In particular, FIG. 4 illustrates a cross-sectional view in the sensing area SA of the display device 10 shown in FIGS. 1 and 2.

Referring to FIGS. 1, 2, and 4, the sensing area SA of the display device 10 may include a display panel 100 and a sensor layer PSL disposed on one surface (e.g., a bottom surface) of the display panel 100. The display panel 100 may include a substrate SUB and may include a circuit element layer BPL, a light emitting element layer LDL, a first protective layer PTL1, an anti-reflection layer RFL, a first adhesive layer ADL1, and a window WIN sequentially disposed in the third direction DR3 on one surface (e.g., a top surface) of the substrate SUB. The display panel 100 may further include a second adhesive layer ADL2 and a second protective layer PTL2 sequentially disposed in the opposite direction of the third direction DR3 between the substrate SUB and the sensor layer PSL. The circuit element layer BPL and the light emitting element layer LDL may constitute a pixel layer PXL.

The substrate SUB is a base substrate of the display panel 100 and may be substantially a transparent transmissive substrate. The substrate SUB may be a rigid substrate including glass or tempered glass, or a flexible substrate made of plastic.

The substrate SUB may include a display area and a non-display area corresponding to the display area AA and the non-display area NA shown in FIGS. 1 and 2. The display area AA may include pixel areas PXA in/on which the respective pixels PX are disposed and/or formed.

The circuit element layer BPL may be disposed on the substrate SUB and may include at least one conductive layer. The circuit element layer BPL may include circuit elements constituting pixel circuits of the pixels PX and may include lines for supplying various power sources and signals for driving the pixels PX. The circuit element layer BPL may include various types of circuit elements (such as at least one transistor and at least one capacitor) and may include conductive layers/lines connected to the circuit elements. The circuit element layer BPL may include at least one insulating layer provided between the conductive layers/lines. The circuit element layer BPL may include a line unit disposed in the non-display area NA to supply a power and a signal through the conductive lines connected to the pixels PX.

The light emitting element layer LDL may be disposed on the circuit element layer BPL. The light emitting element layer LDL may include light emitting elements LD connected to the circuit elements and/or the lines of the circuit element layer BPL through contact holes, etc. At least one of the light emitting elements LD may be disposed in each pixel area PXA.

The light emitting elements LD may emits lights of different colors. The light emitting elements LD may include a red light emitting element emitting red light, a green light emitting element emitting green light, and a blue light emitting element emitting blue light. The light emitting elements LD may include a yellow light emitting element emitting yellow light, a cyan light emitting element emitting cyan light, and a magenta light emitting element emitting magenta light. The light emitting elements LD may emit light of the same color.

The light emitting element LD may be an organic light emitting diode. The light emitting element LD may be an inorganic light emitting diode such as a micro light emitting diode (LED) or a quantum dot light emitting diode. The light emitting element LD may include an organic material and an inorganic material.

The pixel PX may include a single light emitting element LD. The pixel PX may include light emitting elements connected in series and/or in parallel.

The first protective layer PTL1 may be disposed on the light emitting element layer LDL and may cover the display area AA. The first protective layer PTL1 may include an encapsulating member, such as a thin film encapsulation (TFE) layer including at least one inorganic layer and at least one organic layer. The first protective layer PTL1 may include an inorganic layer, an organic layer, and an inorganic layer sequentially stacked. The first protective layer PTL1 may include an encapsulating member/substrate (e.g., a glass substrate). The first protective layer PTL1 may further include a protective film. The first protective layer PTL1 may substantially block moisture, oxygen, and the like from entering the display panel 100.

The anti-reflection layer RFL may be disposed on the first protective layer PTL1. The anti-reflection layer RFL may include black matrices and color filters. The black matrix may absorb or block light introduced from the outside, and the color filter may allow light emitted from the light emitting element layer LDL to selectively pass according to the wavelength or color of the light. When the black matrix and the color filter are disposed on the first protective layer PTL1, the reflection of external light can be sufficiently prevented without any polarizing layer (generally having a thickness of about 100 μm). Further, since the first protective layer PTL1 has a transmittance higher than that of the polarizing layer, contrast and light efficiency can be improved.

The black matrix may include an opening overlapping with (or exposing) a pinhole PIH (or through hole PIH) of a light blocking layer PHL. Accordingly, an optical path is provided to allow reflected light reflected by a finger of a user to advance toward the sensor layer PSL.

The structures and/or arrangements of the black matrix and the color filter included in the anti-reflection layer RFL are further described with reference to FIGS. 6 to 9.

The first adhesive layer ADL1 may be disposed between the anti-reflection layer RFL and the window WIN to bond the anti-reflection layer RFL and the window WIN to each other. The first adhesive layer ADL1 may include a transparent adhesive such as an optically clear adhesive OCA. The first adhesive layer ADL1 may include one or more of various adhesive materials.

The window WIN is a protective member disposed at an uppermost/outmost portion of the display device 10 including the display panel 100, and may be substantially a transparent transmissive substrate. The window WIN may have a multi-layered structure including one or more of a glass substrate, a plastic film, and a plastic substrate. The window WIN may include a rigid or flexible substrate formed of a transparent/transmissive material.

The second protective layer PTL2 may be disposed on the other surface (e.g., a bottom surface) of the substrate SUB. The second protective layer PTL2 may be bonded to the substrate SUB by the second adhesive layer ADL2.

The second adhesive layer ADL2 may firmly bond the substrate SUB and the second protective layer PTL2 to each other. The second adhesive layer ADL2 may include a transparent adhesive such as an OCA. The second adhesive layer ADL2 may include a Pressure Sensitive Adhesive (PSA) that performs adhesion when receiving pressure. When the second adhesive layer ADL2 includes the PSA, the second adhesive layer ADL2 may be attached to the substrate SUB and the second protective layer PTL2 through only pressure without any separate heat treatment or UV treatment at room temperature.

The second adhesive layer ADL may include a material absorbing specific light and/or may include a material blocking the specific light. As an example, the second adhesive layer ADL2 may include an infrared absorbing material absorbing infrared light having a high energy density and/or may include an infrared blocking material blocking the infrared light.

The infrared absorbing material may include an inorganic oxide including Antimony Tin Oxide (ATO), Indium Tin Oxide (ITO), tungsten oxide, or carbon black, and/or may include a metal such as silver (Ag). The inorganic oxide may selectively transmit light in a visible light band, and may absorb infrared light. The infrared absorbing material may include, for example, organic dyes.

The infrared blocking material may be/include at least one of a borate mixture, a carbonate mixture, an aluminate mixture, a nitrate mixture, a nitrite mixture, lithium borate, sodium borate, potassium borate, magnesium borate, calcium borate, strontium borate, barium borate, $Na_2B_4O_x$, colemanite, lithium carbonate, sodium carbonate, potassium carbonate, calcium carbonate, calcite, $CaCO_3$, dolomite, and magnesite. The infrared blocking material may be/include at least one of dyes such as at least one of nickel dithiol, dithiol metal complex, cyanin, squarylium, croconium, diimmonium, aminium, ammonium, phthalocyanine, naphthalocyanine, anthraquinone, naphthoquinone, condensation polymer azo-based pyrrole, polymethine, and a propylene-based compound.

When a finger of a user reaches (or is located on) the image display surface of the display device 10, the display device 10 may sense a fingerprint of the user using photo sensors PHS. When external light is introduced to the display device 10 while the fingerprint of the user is sensed, a visible light band of the external light may be blocked by the finger of the user, but infrared light may pass through the finger of the user and then be incident onto the photo sensors PHS if the infrared light is not blocked or absorbed. The infrared light incident onto the photo sensors PHS may act as noise and decrease the accuracy of recognition of light reflected from the finger of the user.

Since the second adhesive layer ADL2 includes an infrared absorbing material and/or an infrared blocking material, the infrared light of the external light is absorbed and/or blocked by the second adhesive layer ADL2 and is not incident onto the photo sensors PHS even though the infrared light of the external light passes through the finger of the user. Thus, the accuracy of fingerprint recognition can be satisfactory.

The second protective layer PTL2 may block oxygen, moisture, and the like from the outside, and may have a single layer structure or a multi-layer structure. The second protective layer PTL2 may be a film, to ensure the flexibility of the display panel 100. The second protective layer PTL2 may be bonded to the sensor layer PSL through an adhesive layer (not shown) which includes a transparent adhesive such as OCA.

A selective light blocking film may be further provided on the bottom of the second protective layer PTL2. The selective light blocking film may block a specific frequency band of external light introduced to the display device 10, e.g., an infrared light frequency band, thereby preventing the light from being incident onto the photo sensors PHS of the sensor layer PSL. At least one selective light blocking film may overlap the sensor layer PSL and may be provided directly or indirectly on one or more layers of the display device 10.

When a component for blocking infrared light is included in the display panel 100, the selective light blocking film may be optional. For example, when the second adhesive layer ADL2 includes an infrared absorbing material and/or an infrared blocking material, the selective light blocking film may be unnecessary. When a selective light blocking film is disposed in the display device 10, the second adhesive layer ADL2 may not include an infrared absorbing material and/or an infrared blocking material.

The light blocking layer PHL may be disposed between the light emitting element layer LDL and the sensor layer PSL. The light blocking layer PHL may be disposed between the substrate SUB and the circuit element layer BPL as shown in FIG. 4. The light blocking layer PHL may include a plurality of pinholes PIH. The light blocking layer PHL may block a portion of light incident from the outside, e.g., reflected light reflected from a finger, thereby enabling only the remaining portion of the light to reach a lower/rear layer through the pinholes PIH.

The width (e.g., the diameter) of the pinholes PIH may be configured such that light satisfying a field of view FOV (also referred to as a "viewing angle") within a predetermined angle range can be transmitted through the pinholes PIH.

The width (e.g., the diameter) of the pinholes PIH may be at least ten times the wavelength of reflected light. The width of the pinholes PIH may be 4 μm or 5 μm or more such that diffraction of light can be prevented. The width of the pinholes PIH may be set to a size enough to prevent an image blur and to more clearly sense the shape of a fingerprint. The width of the pinholes PIH may be smaller than or equal to about 20 μm. The width of the pinholes PIH may be configured based on the wavelength band of reflected light and/or the thickness or thicknesses of one or more layers of the module.

A distance (e.g., a pitch) between adjacent pinholes PIH may be set in consideration of the distance between the light blocking layer PHL and the sensor layer PSL, the wavelength range of reflected light, and/or the viewing angle FOV. Thus, images observed by the photo sensors PHS can be prevented from overlapping with each other, such that a blur of a fingerprint image can be prevented. The distance between adjacent pinholes PIH is further described with reference to FIGS. 13 to 15.

The light blocking layer PHL may be included in the display panel 100, as illustrated in FIG. 4. The light blocking layer PHL may be disposed between the display panel 100 and the sensor layer PSL.

The sensor layer PSL may be attached to the other surface (e.g., a bottom surface) of the display panel 110 and may at least partially overlap the display panel 100. The sensor layer PSL may overlap the display panel 100 in at least the display area AA. The sensor layer PSL may include photo sensors PHS distributed at a predetermined resolution/density and/or a predetermined distance. The distribution of the photo sensors PHS may be sufficiently dense set such that reflected light reflected from an observation target (e.g., a specific fingerprint area of a finger) can be incident onto at least two adjacent photo sensors PHS.

The photo sensors PHS of the sensor layer PSL may output an electrical sensing signal corresponding to the reflected light received through the pinholes PIH. Reflected lights received by the photo sensors PHS may have different optical characteristics (e.g., frequency, wavelength, intensity, etc.) according to whether the corresponding reflected lights correspond to the valleys or ridges of the fingerprint formed on the finger of the user. Therefore, the photo sensors PHS may output sensing signals having different electrical characteristics, corresponding to the optical characteristics of the respective reflected lights. The sensing signals output from the photo sensors PHS may be converted into an image, and may be used to identify the fingerprint of the user.

Figure 5:
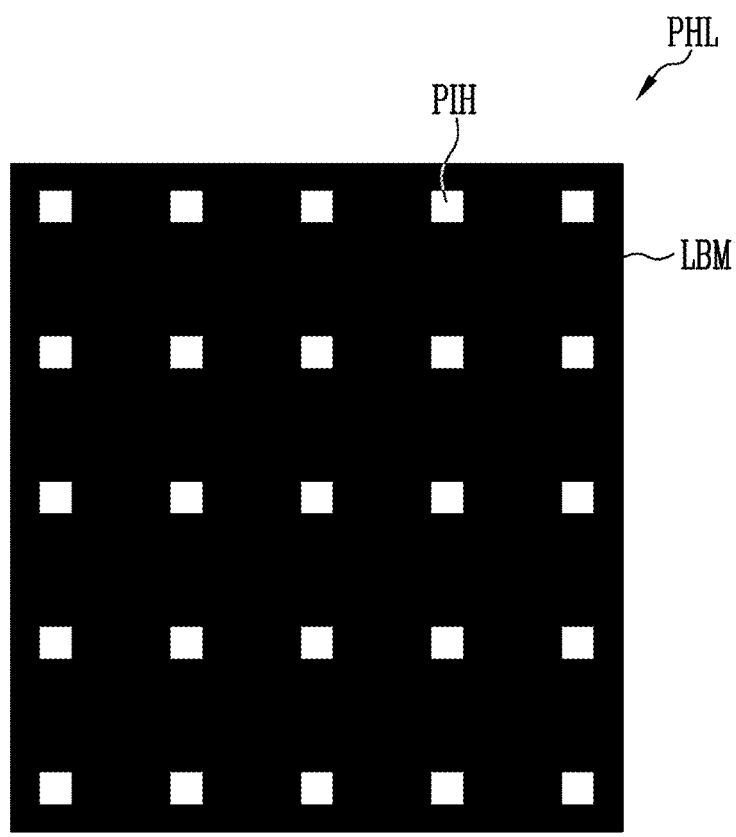
FIG. 5 is a plan view illustrating a light blocking layer in accordance with embodiments.
Figure 5:
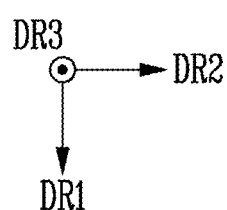

FIG. 5 is a plan view illustrating a light blocking layer in accordance with embodiments.

Referring to FIGS. 4 and 5, the light blocking layer PHL may include a light blocking mask LBM and a plurality of pinholes PIH distributed in the light blocking mask LBM.

The light blocking mask LBM may be formed of a light blocking material and/or a light absorbing material. The light blocking mast LBM may be an opaque (conductive) metal layer including the pinholes PIH. The light blocking mask LBM may be formed of one or more of various materials capable of blocking the transmission of light. The light blocking mask LBM may be formed of a black matrix material known in the art.

The pinholes PIH may be openings distributed in the light blocking mask LBM. The pinholes PIH may be distributed in the light blocking mask LBM in a regular or irregular pattern and may have a certain size and a certain distance. The pinholes PIH may be disposed at a resolution lower than that of the photo sensors PHS disposed on the sensor layer PSL. However, and the size, number, resolution and/or arrangement structure of the pinholes PIH may be changed in various forms.

The pinholes PIH may have one or more of various shapes such as one or more of a rectangular shape, a circular shape, an elliptical shape, and a polygonal shape in a plan view of the light blocking layer PHL.

The light blocking layer PHL may be disposed between the light emitting element layer LDL (in which the light emitting elements LD are arranged) and the sensor layer PSL (in which the photo sensors PHS are arranged) in the display device 10 shown in FIG. 4. The light blocking layer PHL may constitute an optical system for allowing only some lights to be selectively transmitted and for blocking the other lights.

The light blocking layer PHL and the photo sensors PHS may constitute a fingerprint sensor. The light blocking layer PHL may be integrally configured with the circuit element layer BPL of the display panel 100. The module thickness of the photosensitive type fingerprint sensor and the thickness of the display device 10 can be minimized.

The display device 10 in accordance with the present disclosure may include a fingerprint sensor including the light emitting element layer LDL, the sensor layer PSL, and the light blocking layer PHL. The light emitting element layer LDL may include light emitting elements LD which serve as light sources of photosensitive type sensors. The sensor layer PSL may include photo sensors PHS which receive reflected light reflected from an object (e.g., a fingerprint area of the finger) located on the top of the display device 10 after being emitted from the light emitting element layer LDL. The light blocking layer PHL may include pinholes PIH which are disposed between the light emitting element layer LDL and the sensor layer PSL to allow the reflected light to be selectively transmitted.

The fingerprint sensor may further include an optical opening area formed in the display panel 100 so as to reduce the loss of reflected light incident onto each pinhole PIH within the range of a predetermined angle or field of view.

The fingerprint sensor may include a light control layer disposed in the display panel 100 to control an optical path such that the field of view can be more easily controlled. Embodiments of the light control layer are further described with reference to FIGS. 10 and 11.

The display device 10 may utilize the light emitting elements LD of the pixels PXL as light sources of the fingerprint sensor. A display device may include a separate light source for fingerprint sensing.

Some of the lights emitted from the pixels PXL may be incident onto the photo sensors PHS after being reflected from a finger of the user and then passing through the optical opening area and the pinholes PIH formed in layer of the display device 10. The fingerprint shape (fingerprint pattern) of the user may be detected based on the difference between the quantities of lights reflected from the ridges and valleys of the fingerprint and/or the waveforms of the reflected lights.

The light blocking layer PHL including the pinholes PIH enables fingerprint detection, as illustrated in FIG. 5. Alternatively or additionally, a collimator layer may be for fingerprint detection. The collimator layer may filter lights such that the photo sensor PHS can receive only lights reflected by the finger. The collimator layer may have openings (or pinholes) or slits. The openings (or pinholes) or the slits may allow only lights having a wavelength of 600 nm or less among lights incident onto the collimator layer to be transmitted. Thus, the collimator layer can prevent unwanted light (not the light incident after being reflected by the finger) from being incident onto the photo sensor PHS.

Figure 6:
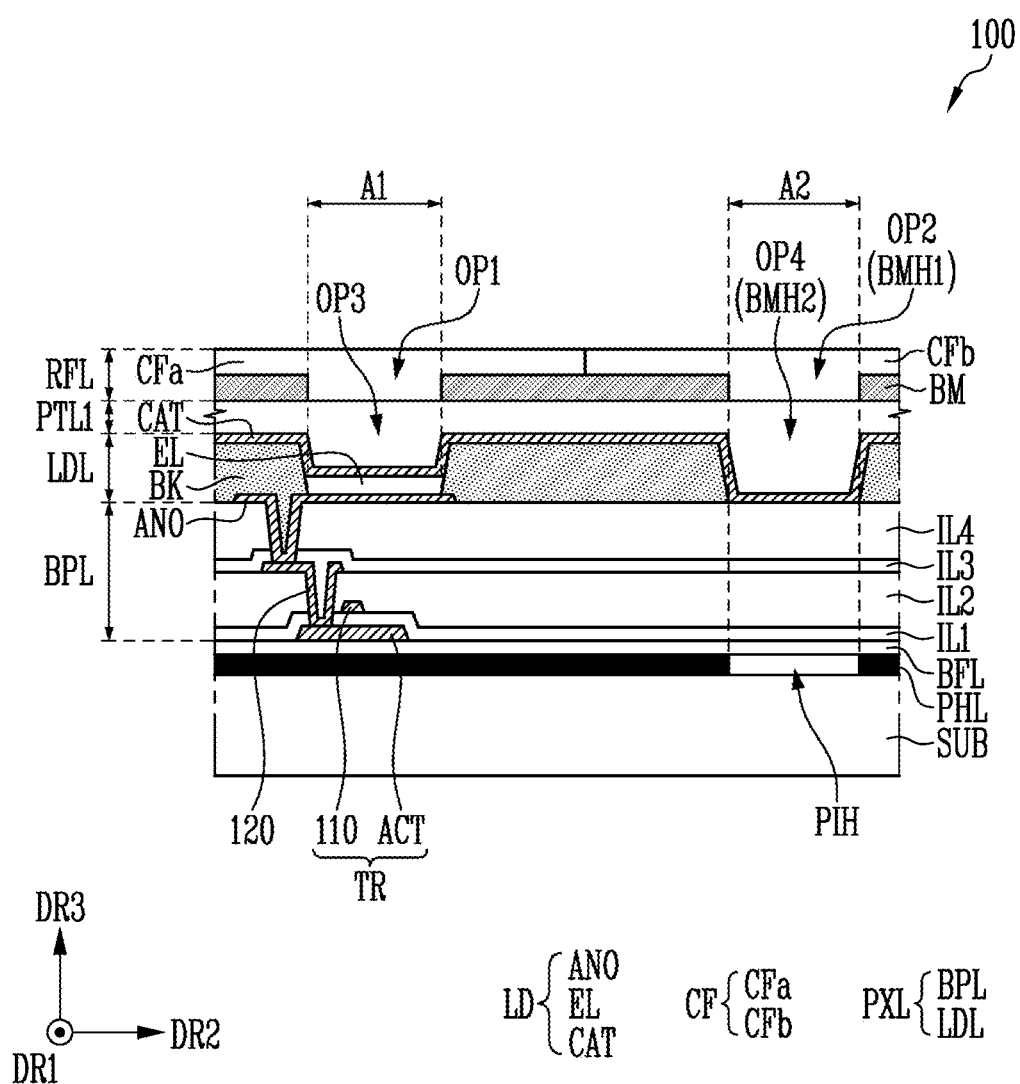
FIG. 6 is a schematic cross-sectional view of a display panel in accordance with embodiments.

FIG. 6 is a schematic cross-sectional view of a display panel in accordance with embodiments. FIG. 6 illustrates a cross-sectional view in the sensing area SA of the display panel 100 shown in FIGS. 1 and 2.

Referring to FIGS. 4 and 6, the display panel 100 may include a substrate SUB, and a buffer layer BFL, a circuit element layer BPL, a light emitting element layer LDL, a first protective layer PTL1, and an anti-reflection layer RFL, which are sequentially disposed along the third direction DR3 on one surface (e.g., a top surface) of the substrate SUB.

The display panel 100 may further include a light blocking layer PHL between the substrate SUB and the buffer layer BFL. The light blocking layer PHL may include a pinhole PIH, and the pinhole PIH may overlap with (or may be positioned in) the second area A2 of the display panel 100. The second area A2 may include an optical path for transmitting reflected light (reflected by a finger of a user) toward the sensor layer PSL (disposed on a lower surface of the substrate SUB).

The buffer layer BFL may be disposed on the light blocking layer PHL. The buffer layer BFL is disposed on one surface (e.g., a bottom surface) of a pixel layer PXL, to prevent diffusion of impurity ions and to prevent infiltration of moisture.

The circuit element layer BPL may be disposed on the substrate SUB (and/or on the buffer layer BFL). The circuit element layer BPL may include a transistor TR including a semiconductor layer ACT and a first conductive layer 110, a second conductive layer 120, and insulating layers IL1, IL2, IL3, and IL4.

The semiconductor layer ACT may be disposed on the substrate SUB.

The semiconductor layer ACT may form a channel of the transistor TR. The semiconductor layer ACT may include a channel region and may include a source region and a drain region at opposite ends of the channel region.

The semiconductor layer ACT may include polycrystalline silicon. The polycrystalline silicon may be formed by crystallizing amorphous silicon. When the semiconductor layer ACT is made of poly-crystalline silicon, portions of the semiconductor layer ACT doped with ions may have conductivity.

The semiconductor layer ACT may include single crystalline silicon, low temperature polycrystalline silicon, amorphous silicon, or an oxide semiconductor. The oxide semiconductor may include a two-component compound (ABx), a three-component compound (ABxCy), or a four-component compound (ABxCyDz) that contains one or more of indium (In), zinc (Zn), gallium (Ga), tin (Sn), titanium (Ti), aluminum (Al), hafnium (Hf), zirconium (Zr), magnesium (Mg), etc. The semiconductor layer ACT may include Indium Tin Zinc Oxide (ITZO) or Indium Gallium Zinc Oxide (IGZO).

A first insulating layer IL1 may be disposed over the semiconductor layer ACT. The first insulating layer IL1 may be disposed on the entire surface of the substrate SUB. The first insulating layer IL1 may be a gate insulating layer insulating a gate electrode from the semiconductor layer ACT. The first insulating layer IL1 may include a silicon compound, a metal oxide, or the like. The first insulating layer IL1 may include silicon oxide, silicon nitride, silicon oxynitride, aluminum oxide, tantalum oxide, hafnium oxide, zirconium oxide, titanium oxide, or the like. The first insulating layer IL1 may be a single layer or may have a multi-layer structure with stacked layers of different materials.

The first conductive layer 110 may be disposed on the first insulating layer IL1. The first conductive layer 110 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chrome (Cr), calcium (Ca), titanium (Ti), tungsten (W), and copper (Cu). The first conductive layer 110 may be a single layer or may include a multi-layer structure.

The first conductive layer 110 may constitute/include a gate electrode of the transistor TR and may overlap the channel region of the semiconductor layer ACT.

A second insulating layer IL2 may be disposed over the first conductive layer 110. The second insulating layer IL2 may be disposed on the entire surface of the substrate SUB. The second insulating layer IL2 may insulate the first conductive layer 110 and the second conductive layer 120 from each other. The second insulating layer IL2 may be an interlayer insulating layer. One or more materials of the second insulating layer IL2 may be the same as or different from one or more materials of the first insulating layer IL1.

The second conductive layer 120 may be disposed on the second insulating layer IL2. The second conductive layer 120 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chrome (Cr), calcium (Ca), titanium (Ti), tungsten (W), and copper (Cu). The second conductive layer 120 may be a single layer or may include a multi-layer structure. The second conductive layer 120 may have a stacked structure of Ti—Al—Ti, Mo—Al—Mo, Mo—AlGe—Mo, and/or Ti—Cu.

The second conductive layer 120 may include a connection electrode in (direct) contact with the source region or the drain region the semiconductor layer ACT. As shown in FIG. 6, the connection electrode of the second conductive layer 120 may be connected to one end of the semiconductor layer ACT through a contact hole exposing the source region or the drain region of the semiconductor layer ACT.

Although not shown in the drawing, the second conductive layer 120 may further include a data line for transferring a data signal.

A third insulating layer IL3 may be disposed over the second conductive layer 120. The third insulating layer IL3 is disposed over the transistor TR to protect the transistor TR. One or more materials of the third insulating layer IL3 may be the same as or different from one or more materials of the first insulating layer IL1.

A fourth insulating layer IL4 may be disposed on the third insulating layer IL3. The fourth insulating layer IL4 may be a via layer. The fourth insulating layer IL4 may include an organic insulating material such as polyacrylates resin, epoxy resin, phenolic resin, polyamides resin, polyimides resin, unsaturated polyesters resin, polyphenylenethers resin, polyphenylenesulfides resin, or benzocyclobutene (BCB).

The light emitting element layer LDL may be disposed on the circuit element layer BPL. The light emitting element layer LDL may include a light emitting element LD including a pixel electrode ANO, an emitting layer EL, and (a portion of) a common electrode CAT, and may include a bank layer BK including openings OP3 and OP4.

The light emitting element LD may be disposed on the fourth insulating layer IL4.

The light emitting element LD may be connected to the transistor TR.

The pixel electrode ANO may include a conductive oxide such as Indium Tin Oxide (ITO), Indium Zinc Oxide (IZO), Zinc Oxide (ZnO), Indium Oxide ($In_2O_3$), Indium Gallium Oxide (IGO), or Aluminum Zinc Oxide (AZO). The pixel electrode ANO may include a reflective layer including Ag, Mg, Al, Pt, Pd, Au, Ni, Nd, Ir, Cr or an alloy of some of the above metals. The pixel electrode ANO may further include a layer formed of ITO, IZO, ZnO, or $In_2O_3$ on the top/bottom of the reflective layer.

The pixel electrode ANO may be connected to the connection electrode of the second conductive layer 120 through a contact hole penetrating the fourth insulating layer IL4 and the third insulating layer IL3. The pixel electrode ANO may be electrically connected to the semiconductor layer ACT (e.g., the source region or the drain region of the semiconductor layer ATC) of the transistor TR through the connection electrode of the second conductive layer 120.

The bank layer BK may be disposed on the pixel electrode ANO.

The bank layer BK may be an organic layer including at least on of acryl resin, epoxy resin, phenolic resin, polyamide resin, a polyimide resin, etc.

The bank layer BK may include a light absorbing material or may be coated with a light absorbing agent to absorb light incident from the outside. The bank layer BK may include a carbon-based black pigment. The bank layer BK may include an opaque metal material, such as chromium (Cr), molybdenum (Mo), an alloy (MoTi) of molybdenum and titanium, tungsten (W), vanadium (V), niobium (Nb), tantalum (Ta), manganese (Mn), cobalt (Co), or nickel (Ni), which has high light absorptivity.

The bank layer BK may include a third opening OP3 exposing the pixel electrode ANO. The bank layer BK may accommodate the emitting layer EL inside the third opening OP3. The third opening OP3 of the bank layer BK can define a first area A1 (or an emission area) of the display panel 100, which provides an optical path to transmit light emitted from the light emitting element LD toward an upper portion of the display panel 100 (e.g., in the third direction DR3). The third opening OP3 may partially expose the pixel electrode ANO of the light emitting element LD.

The bank layer BK may include a fourth opening OP4 partially exposing the fourth insulating layer IL4. The fourth opening OP4 may define the second area A2 of the display panel 100, which provides an optical path to transmit reflected light reflected by the finger of the user toward the sensor layer PSL disposed on the lower surface of the substrate SUB. The fourth opening OP4 may overlap with the pinhole PIH of the light blocking layer PHL.

The first area A1 and the second area A2 may be included in the sensing area SA shown in FIGS. 1 and 2.

The emitting layer EL may be disposed in the third opening OP3 of the bank layer BK. The emitting layer EL may include an organic material for emitting light of a predetermined color. The emitting layer EL may include a hole transporting layer, an organic material layer, and an electron transporting layer.

The common electrode CAT may be disposed over the emitting layer EL. The common electrode CAT may substantially cover an entire surface of the substrate SUB.

The common electrode CAT may include a material having a low work function, such as Li, Ca, LiF—Ca, LiF—Al, Al, Mg, Ag, Pt, Pd, Ni, Au Nd, Ir, Cr, BaF, Ba, or an alloy or mixture of some of the metals (e.g., a mixture of Ag and Mg). The common electrode CAT may further include a transparent metal oxide layer disposed on the material having the low work function.

A pixel PX may include at least one light emitting element LD and at least one transistor TR and may overlap with the first area A1. The second area A2 may not overlap with any pixel PX. A second area A2 may be between first areas A1.

The first protective layer PTL1 may be disposed on the common electrode CAT.

The anti-reflection layer RFL may be disposed on the first protective layer PTL1. The anti-reflection layer RFL may block reflection of external light; therefore, no separate polarizing plate may be required in the display panel 100. Thus, degradation of luminance due to the reflection of external light can be prevented, and the thickness of the display panel 100 can be minimized.

The anti-reflection layer RFL may include a black matrix BM.

The black matrix BM may be disposed on the first protective layer PTL1.

The black matrix BM may include an organic light blocking material. The organic light blocking material may include at least one of carbon black (CB) and titan black (TiBK).

The black matrix BM may include a first opening OP1 overlapping with the third opening OP3 of the bank layer BK. The black matrix BM may overlap with the bank layer BK in the third direction DR3 and may expose the third opening OP3 in the third direction DR3. The first opening OP1 may be in the first area A1 of the display panel 100.

The black matrix BM may include a second opening OP2 overlapping with the fourth opening OP4 of the bank layer BK and the pinhole PIH of the light blocking layer PBL. The black matrix BM may overlap with the bank layer BK in the third direction DR3 and may expose the fourth opening OP4 in the third direction DR3. The second opening OP2 may be in the second area A2 of the display panel 100.

The second opening of the black matrix BM may be defined as a first light transmitting hole BMH1, and the fourth opening OP4 of the bank layer BK may be defined as a second light transmitting hole BMH2. The first light transmitting hole BMH1 and the second light transmitting hole BMH2 may overlap with the pinhole PIH to provide an optical path of reflected light reflected by the finger of the user.

The anti-reflection layer RFL may further include a color filter CF set disposed on the black matrix BM. The color filter set CF may include a first color filter CFa and a second color filter CFb.

The first color filter CFa may overlap with the first opening OP1 and the third opening OP3 along the third direction DR3. The first color filter CFa may be one of a red color filter, a green color filter, and a blue color filter according to the color of light emitted from the emitting layer EL of the light emitting element LD. The first color filter CFa may be one of a yellow color filter, a cyan color filter, and a magenta color filter according to the color of light emitted from the emitting layer EL of the light emitting element LD.

The second color filter CFb may overlap with the pinhole PIH, the fourth opening OP4, and the second opening OP2 along the third direction DR3.

The second color filter CFb may be a green color filter. The reflection of external light having a long wavelength in the second opening OP2 and the fourth opening OP4 can be minimized.

Since the second color filter CFb is a green color filter, external light having a long wavelength and incident onto the sensor layer PSL can be blocked. Accordingly, the signal-to-noise ratio (SNR) of a fingerprint recognition signal can be improved. The second color filter CFb may be a red color filter or a blue color filter.

The first color CFa and the second color filter CFb may be of different colors. The first color CFa and the second color filter CFb may be of the same color. For example, when both the first color CFa and the second color filter CFb are green color filters, the first color CFa and the second color filter CFb may be integrally formed.

Figure 7:
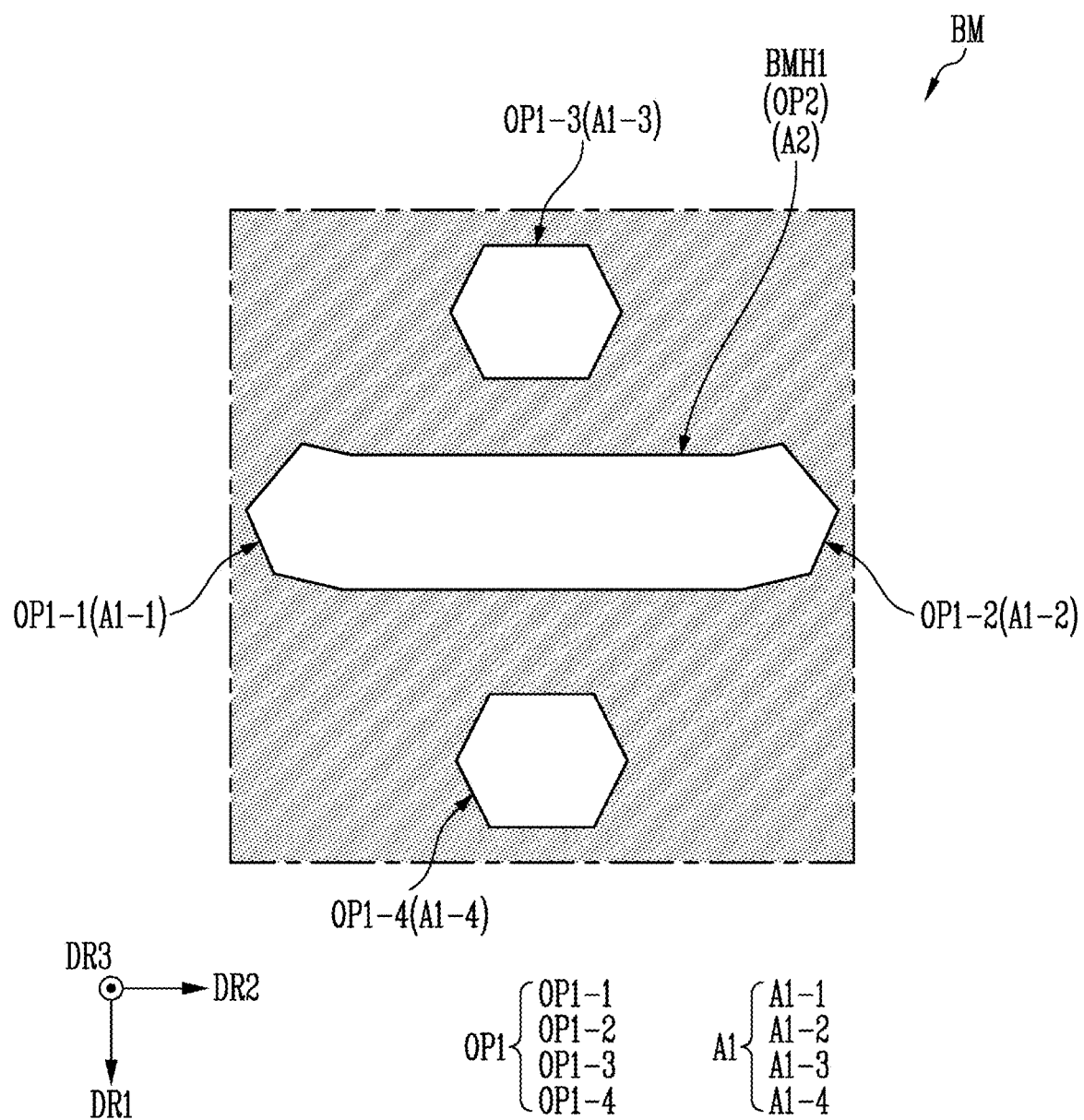
FIG. 7 is a plan view schematically illustrating a portion of a black matrix in accordance with embodiments.
Figure 8:
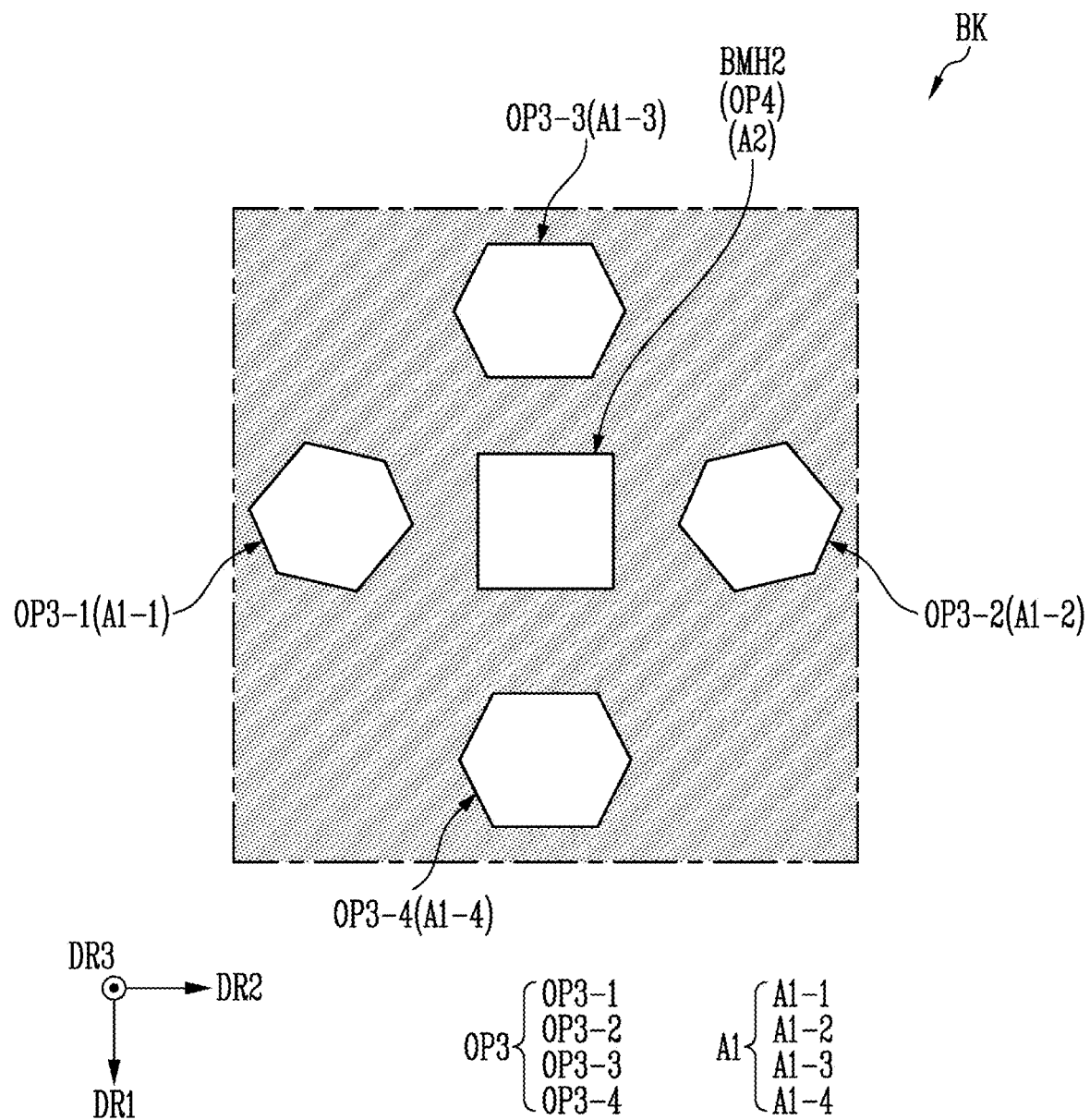
FIG. 8 is a plan view schematically illustrating a portion of a bank layer in accordance with embodiments.
Figure 9:
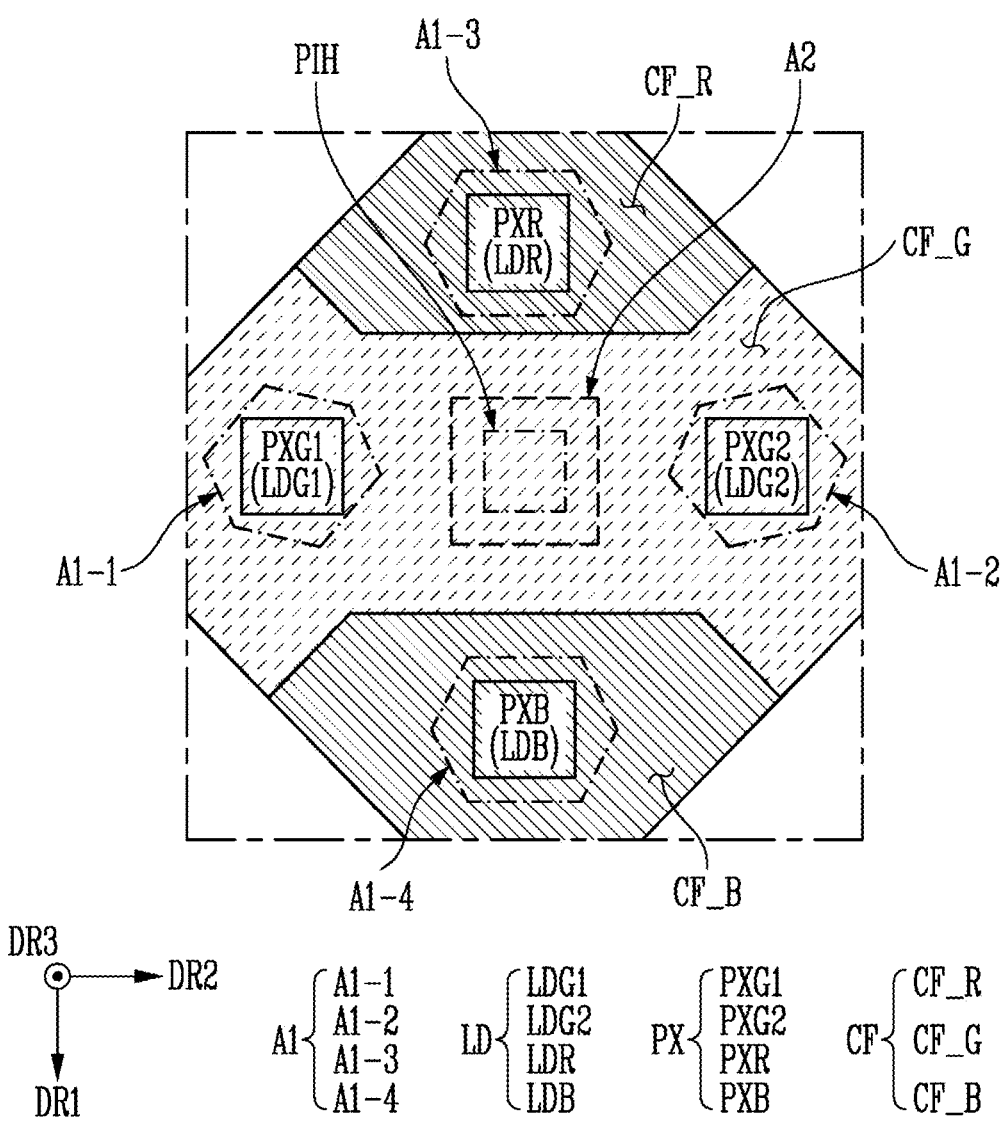
FIG. 9 is a plan view schematically illustrating a portion of a color filter in accordance with embodiments.

FIG. 7 is a plan view schematically illustrating a portion of a black matrix in accordance with embodiments. FIG. 8 is a plan view schematically illustrating a portion of a bank layer in accordance with embodiments. FIG. 9 is a plan view schematically illustrating a portion of a color filter in accordance with embodiments. In FIG. 9, a first pixel PXG1 and a second pixel PXG2 both emitting first color light (or green light), a third pixel PXR emitting second color light (or red light), a fourth pixel PXB emitting third color light (or blue light), and a color filter set CF overlapping with the pixels PXG1, PXG2, PXR, and PXB are illustrated.

Referring to FIGS. 6 to 9, the black matrix BM may include first openings OP1 and second openings OP2 (first light transmitting holes BMH1).

The first openings OP1 may include openings OP1-1, OP1-2, OP1-3, and OP1-4 corresponding to four pixels PX (or four light emitting elements LD). The opening OP1-1 may overlap with an area A1-1 and may corresponding to the first pixel PXG1, the opening OP1-2 may overlap with an area A1-2 and may correspond to the second pixel PXG2, the opening OP1-3 may overlap with an area A1-3 and may correspond to the third pixel PXR, and the opening OP1-4 may overlap an area A1-4 and may correspond to the fourth pixel PXB. The areas A1-1, A1-2, A1-3, and A1-4 may be spaced from each other.

The bank layer BK may include third openings OP3 and fourth openings OP4 (second light transmitting holes BMH2).

The third openings OP3 may include openings OP3-1, OP3-2, OP3-3, and OP3-4 corresponding to four pixels PX (or four light emitting elements LD). The opening OP3-1 may overlap with the area A1-1, the opening OP3-2 may overlap with the second area A1-2, the opening OP3-3 may overlap with the third area A1-3, and the opening OP3-4 may overlap with the fourth area A1-4.

The positions, shapes, and sizes of the openings OP1 and OP2 of the black matrix BM and the openings OP3 and OP4 of the bank layer BK may be configured according to embodiments.

The color filter set CF may include a green color filter CF_G (or first color filter), a red color filter CF_R (or second color filter), and a blue color filter CF_B (or third color filter).

Each of the green color filter CF_G, the red color filter CG_R, and the blue color filter CF_B may correspond to a light emitting element LD of a corresponding pixel PX.

The green color filters CF_G may overlap with a first light emitting element LDG1 and a second light emitting element LDG2 of the first pixel PXG1 and the second pixel PXG2 emitting green light (or first color light), the red color filter CF_R may overlap with a third light emitting element LDR of the third pixel PXR emitting red light (or second color light), and the blue color filter CF_B may overlap with a fourth light emitting element LDB of the fourth pixel PXB emitting blue light (or third color light). One or more of the color filters CF_G, CF_R, and CF_B may be analogous to the first color filter CFa shown in FIG. 6.

The green color filter CF_G may extend between first areas A1 of at least two pixels PX each including a light emitting element LD emitting green light. The green color filter CF_G may extend between first openings OP1 (or third openings OP3) of the first pixel PXG1 and the second pixel PXG2. The green color filter CF_G may extend between the opening OP1-1 and the sopening OP1-2. The green color filter CF_G may overlap with the pinhole PIH, the first light transmitting hole BMH1, and the second light transmitting hole BMH2 along the third direction DR3. The green color filter CF_G may be analogous to the second color filter CFb.

At least some of the first openings OP1 may be integrally formed with (or directly connected to) at least one second opening OP2. For example, the opening OP1-1 and the opening OP1-2 may be integrally formed with a second opening OP2.

Because the green color filter CF_G overlaps with the pinhole PIH, the first light transmitting hole BMH1, and the second light transmitting hole BMH2, the reflection of external light having a long wavelength in the second area A2 overlapping with the sensor layer PSL can be minimized, and the signal-to-noise ratio (SNR) of a fingerprint recognition signal can be improved.

Figure 10:
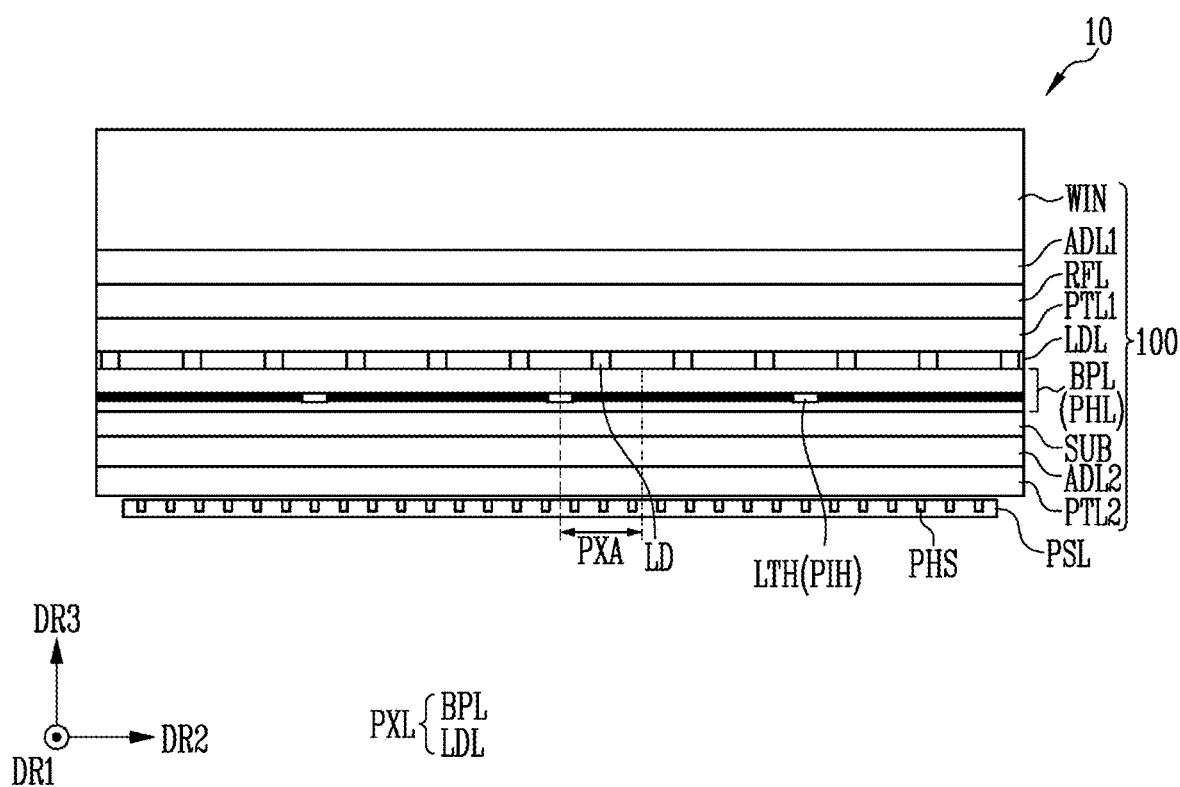
FIG. 10 is a schematic cross-sectional view of a display device in accordance with embodiments.
Figure 11:
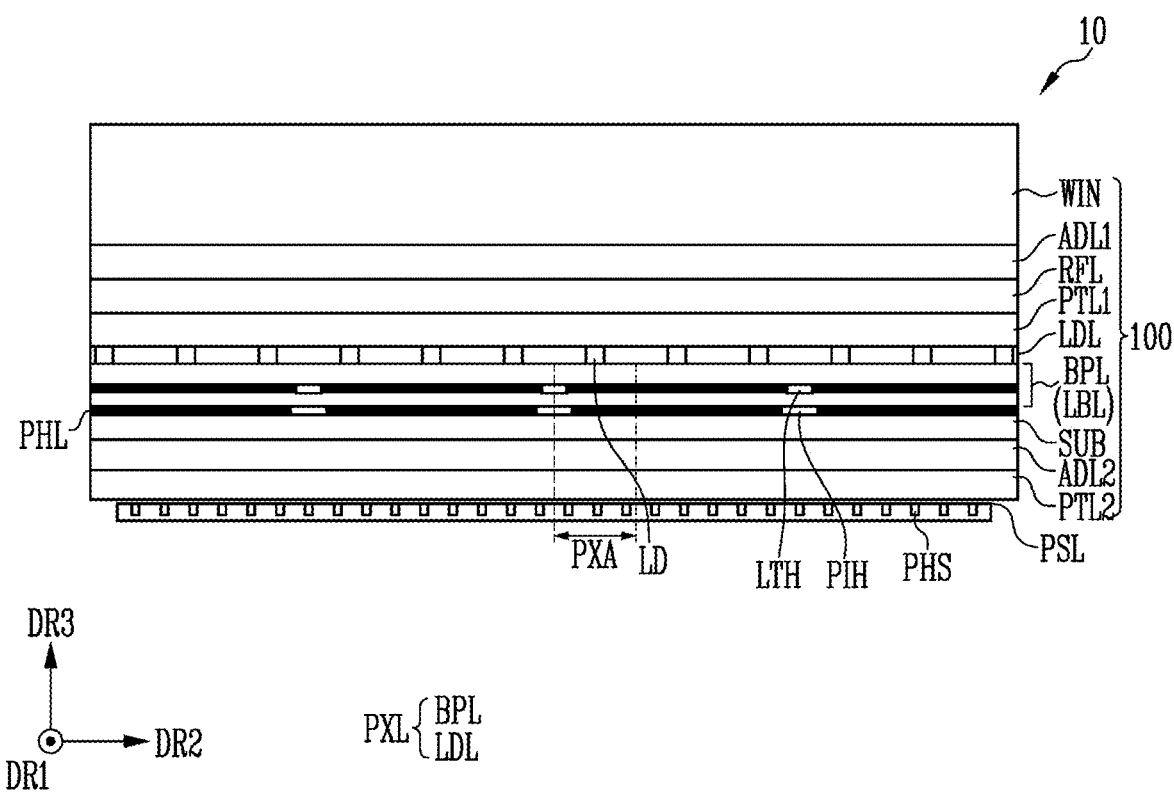
FIG. 11 is a schematic cross-sectional view of a display device in accordance with embodiments.
Figure 12:
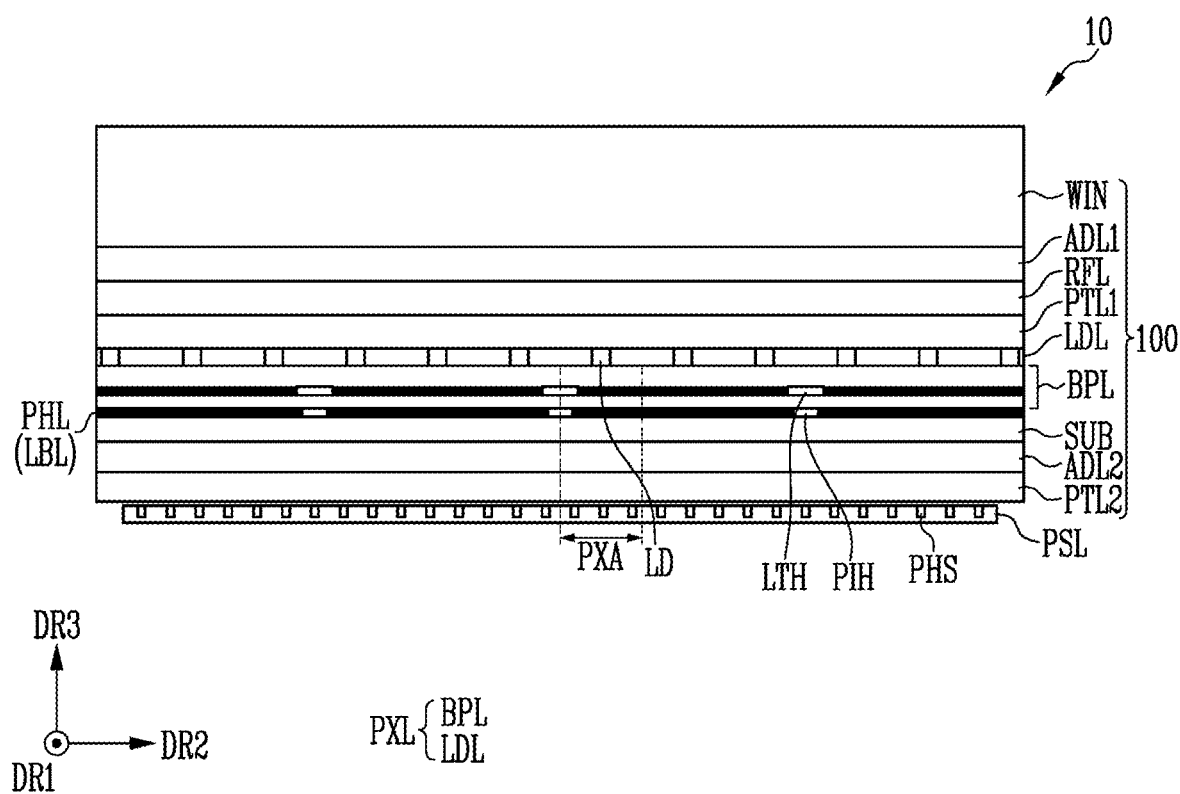
FIG. 12 is a schematic cross-sectional view of a display device in accordance with embodiments.

FIG. 10 is a schematic cross-sectional view of a display device in accordance with embodiments. FIG. 11 is a schematic cross-sectional view of a display device in accordance with embodiments. FIG. 12 is a schematic cross-sectional view of a display device in accordance with embodiments. In FIGS. 10 to 12, some components may be similar or identical to some components described with reference to one or more of FIGS. 1 to 9.

Referring to FIG. 10, a circuit element layer BPL may include a plurality of light transmission holes LTH (or openings) disposed in a sensing area SA. The light transmission holes LTH may be positioned between circuit elements and/or lines of the circuit element layer BPL. The circuit element layer BPL may serve as a light blocking layer PHL. The light transmission holes LTH may serve as pinholes PIH.

When the pinholes PIH are the light transmission holes LTH distributed in the circuit element layer BPL, no additional light blocking layer PHL may be required, and no separate mask process for forming the light blocking layer PHL may be required. Advantageously, the thickness of the display device 10 may be minimized, the manufacturing cost of the display device 10 can be reduced, and the associated process efficiency can be increased.

Referring to FIGS. 11 and 12, a circuit element layer BPL may include a plurality of light transmission holes LTH. A light blocking layer PHL including a plurality of pinholes PIH may be disposed between a substrate SUB and the circuit element layer BPL. Each light transmission hole LTH and a corresponding pinhole PIH at least partially overlap with each other.

The size(s) of the light transmission holes LTH may be equal or unequal to the size(s) of the pinholes PIH. The width (or diameter) of each light transmission hole LTH may be smaller than that of each pinhole PIH, as shown in FIG. 11. Each of the pinholes PIH and each of the light transmission holes LTH may have a width (or diameter) in a range of 5 μm to 20 μm.

When the light transmission holes LTH are smaller than the pinholes PIH, the circuit element layer BPL may perform a function of a light control layer LBL for controlling a path of light (e.g., limiting a field of view of reflected light to a predetermined angle range), and the light blocking layer PHL may perform a light blocking function.

The width (or diameter) of each light transmission hole LTH may be greater than that of each pinhole PIH, as shown in FIG. 12. The circuit element layer BPL may perform a light blocking function, and the light blocking layer PHL may perform a function of the light control layer LBL for controlling the path of light.

Figure 13:
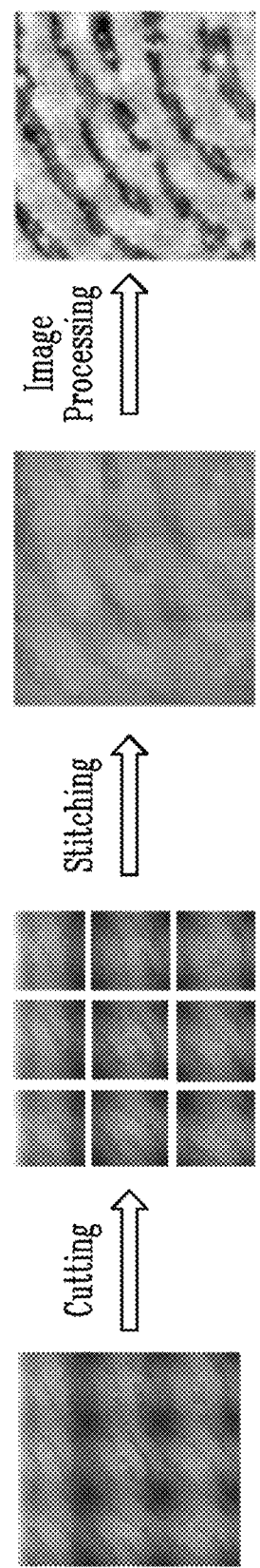
FIG. 13, FIG. 14, and FIG. 15 are views illustrating dimensions related to pinholes in a display device in accordance with embodiments.
Figure 14:
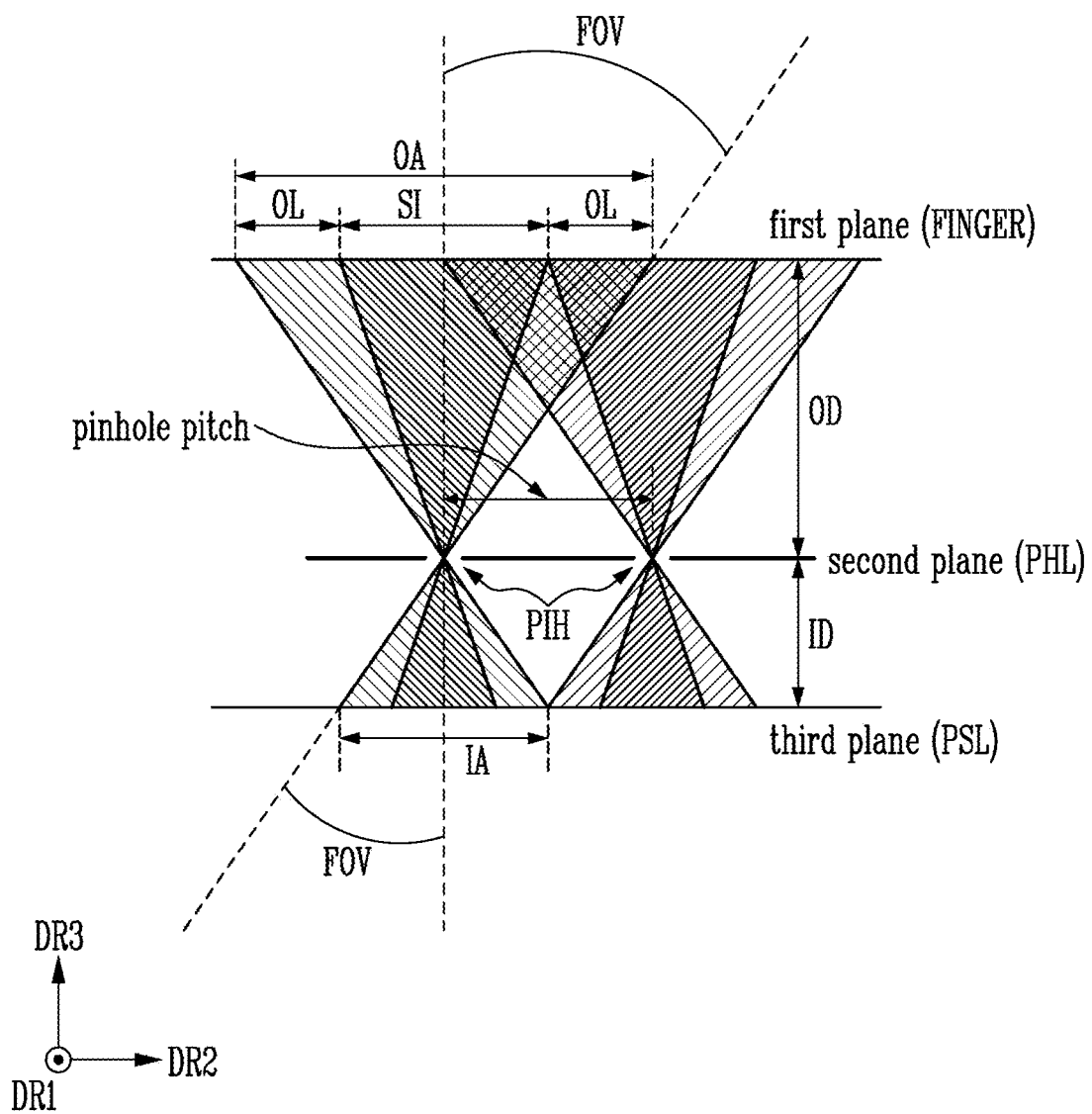
Figure 15:
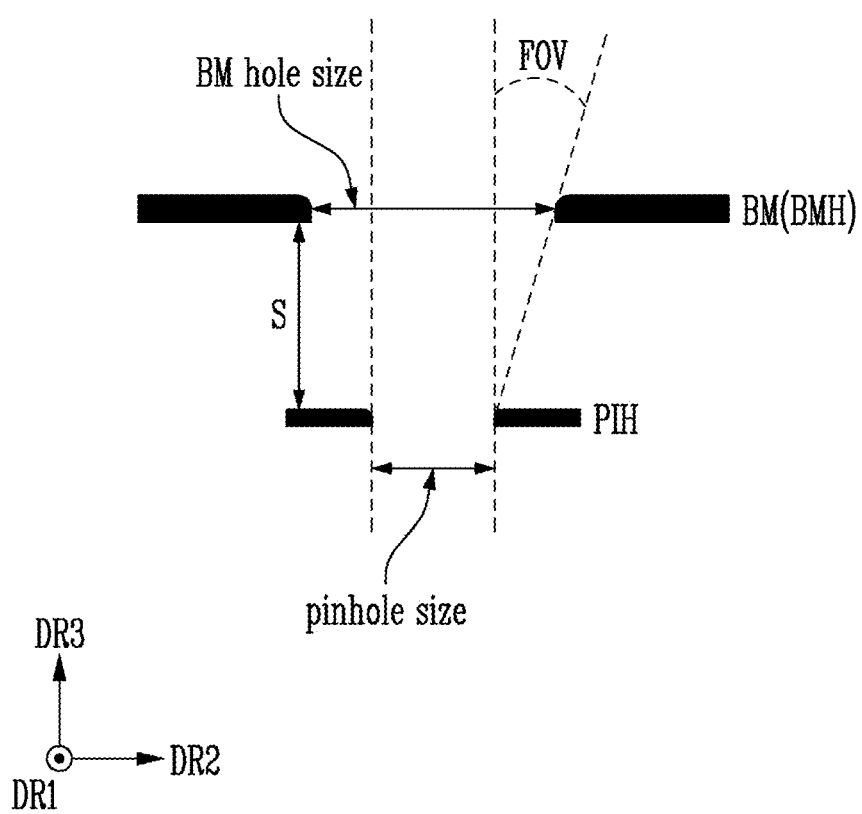

FIGS. 13 to 15 are views illustrating a distance between adjacent pinholes in a display device in accordance with embodiments. A fingerprint sensing process of the fingerprint detector 220 included in the display device 10 is illustrated in FIG. 13, and distances between components and/or structures included in the display device 10 are illustrated in FIGS. 14 and 15.

Referring to FIGS. 1, 2, 4, 6, and 13, the fingerprint detector 220 included in the display device 10 may cut (or divide) an image acquired by the photo sensors PHS (included in the sensor layer PSL), stitch (i.e., combine or synthesize) the cut images (using overlapping areas of the cut images), and then sense a fingerprint image of a user through image processing. Overlapping areas of cut images may represent the same image.

FIG. 14 illustrates a first plane for contacting a finger of a user, a second plane at the positions of the pinholes PIH (included in the light blocking layer PHL), and a third plane at the position of the sensor layer PSL.

A distance between the first plane and the second plane in the third direction DR3 may be defined as an optical distance OD, and a distance between the second plane and the third plane in the third direction DR3 may be defined as an image distance ID. An area formed on the first plane according to the viewing angle FOV and corresponding to one pinhole PIH may be defined as a target area/width OA, and the target area/width OA may include overlapping areas/widths OL and a synthetic area/width SI. An area/width formed on the third plane according to the viewing angle FOV and corresponding to one pinhole PIH may be defined as an image area/width IA.

A pinhole pitch, i.e., a distance between the centers of two immediately adjacent pinholes PIH (in the second direction DR2), may be determined by considering a distance between the light blocking layer PHL and the sensor layer PSL in the third direction DR3, i.e., the image distance ID between the second plane and the third plane. The distance between the centers of immediately adjacent pinholes PIH may be equal to or greater than the size of the image area/width AI in the second direction DR2. The distance between the centers of adjacent pinholes PIH may satisfy the following Expression 1.

$$\text{pinhole pitch} \geq 2 \times \text{ID} \times \tan(\text{FOV}) = IA \qquad \text{Expression 1}$$

In Expression 1, "pinhole pitch" may mean a distance (μm) between adjacent pinholes PIH in the second direction DR2, ID may mean an image distance ID (μm), FOV may mean a viewing angle) (°), and IA may mean a length (μm) of the image area/width IA in the second direction DR2.

At least a portion of the target area OA may be set as overlapping areas OL. In order to perform the above-described stitching operation of the fingerprint detector 220, at least a portion of the target area OA should be set as overlapping areas OL. In order to secure a false rejection rate (FRR) in fingerprint recognition that is 3% or less, a width of the overlapping area OL in the second direction DR2 should be set as 90 μm or more.

Excluding the overlapping areas/widths OL, the remaining area/width in the target area/width OA is defined as the synthetic area/width SI. The size/length of the synthetic area/width SI in the second direction DR2 may be equal to the pinhole pitch, i.e., the distance between the centers of immediately adjacent pinholes PIH.

A size/length of each overlapping area/width OL in the second direction DR2 may be calculated according to the following Expression 2.

$$OL = \frac{OA - SI}{2} = \frac{2(OD \times \tan(FOV)) - (\text{pinhole pitch})}{2} \qquad \text{Expression 2}$$

In Expression 2, "OL" may mean a size/length (μm) of the overlapping area/width OL in the second direction DR2, "OA" may mean a size/length (μm) of the target area/width OA in the second direction DR2, "SI" may mean a size/length (μm) of the synthetic area/width SI in the second direction DR2, and "OD" may mean an optical distance OD (μm).

According to Expression 2, the size/length of the overlapping area/width OL may increase as the viewing angle FOV increases. The viewing angle FOV may be limited due to the black matrix BM of the anti-reflection layer RFL (described with reference to FIGS. 4 and 6 to 9).

FIG. 15 illustrates a first light transmitting hole BMH1 of the black matrix BM and a corresponding pinhole PIH. A viewing angle FOV may be calculated using the following Expression 3.

$$FOV = \tan^{-1}\left(\frac{(BM \text{ hole size} - \text{pinhole size})/2}{S}\right) \qquad \text{Expression 3}$$

In Expression 3, "S" may mean a distance (μm) between the black matrix BM and the pinhole PIH in the third direction DR3, "BM hole size" may mean a width (μm) of the first light transmitting hole BMH1 in the second direction DR2, and "pinhole size" may mean a width (μm) of the pinhole PIH in the second direction DR2.

The viewing angle FOV may depend on the width of the first light transmitting hole BMH1. However, the width of the first light transmitting hole BMH1 of the black matrix BM may be limited so as to achieve the reflection of external light in the anti-reflection layer RFL; therefore, the size of the viewing angle FOV may be limited. The viewing angle FOV may be 18° or less according to the limitation of the width of the first light transmitting hole BMH1.

The size of the overlapping area/width OL may be limited according to the limitation of the viewing angle FOV. In order for the size of the overlapping area/width OL to be a certain distance (e.g., a distance of 90 μm or more), it is necessary to decrease the distance between adjacent pinholes PIH (see Expression 2). However, the distance between the centers of immediately adjacent pinholes PIH should be equal to or greater than the size of the image area/distance IA (see Expression 1). The distance between the centers of two immediately adjacent pinholes PIH may be 356 μm or less.

In the display device, the distance between the centers of two immediately adjacent pinholes PIH is determined by considering the viewing angle FOV and/or the distance between components, so that a fingerprint recognition error of the fingerprint detector 220 can be minimized.

In accordance with embodiments, the display device including the photosensitive type fingerprint sensor includes the anti-reflection layer for blocking reflection of external light, so that no additional polarizing layer may be required. Accordingly, the thickness of the display panel can be minimized.

In accordance with embodiments, the opening overlapping with the pinhole is formed on the bank layer included in the light emitting element layer and the black matrix included in the anti-reflection layer, so that an optical path can be provided to transmit reflected light reflected by a finger of a user toward the sensor layer.

Example embodiments have been described. Features described in connection with a particular embodiment may be used singly or in combination with features described in connection with other embodiments unless otherwise specifically indicated. Various changes in form and details may be made to the example embodiments without departing from the scope set forth in the following claims.

What is claimed is:

1. A display device comprising:
    a sensor layer comprising photo sensors;
    a substrate positioned on the sensor layer;
    a pixel layer positioned on the substrate and comprising pixels, wherein the substrate is positioned between the sensor layer and the pixel layer, and wherein the pixels comprise pixel electrodes;
    a black matrix positioned on the pixel layer, comprising first-set openings respectively overlapping the pixel electrodes, and comprising second-set openings not overlapping any pixel electrodes of the display device in a direction perpendicular to the substrate, wherein the pixel layer is positioned between the substrate and the black matrix;
    a color filter set positioned on the black matrix; and
    a light blocking layer positioned between the substrate and the pixel layer and comprising through holes,
    wherein at least one of the through holes overlaps the second-set openings,
    wherein the color filter set includes at least one color filter overlapping one of the first-set openings and one of the second-set openings;
    wherein the second-set openings entirely pass through the black matrix in the direction,
    wherein the pixels comprise a first pixel and a second pixel each emitting first color light, a third pixel emitting second color light, and a fourth pixel emitting third color light,
    wherein the first-set openings comprise a first first-set opening overlapping with the first pixel, a second first-set opening overlapping with the second pixel, a third first-set opening overlapping with the third pixel, and a fourth first-set opening overlapping with the fourth pixel, and
    wherein at least two of the first first-set opening, the second first-set opening, the third first-set opening, and the fourth first-set opening are spaced from each other,
    wherein the pixel layer comprises:
    a circuit element layer comprising transistors that respectively overlap with the first-set openings and comprising an insulating layer that covers the transistors; and
    a light emitting element layer positioned on the circuit element layer and comprising emitting layers that respectively overlap with the first-set openings, and
    wherein the circuit element layer comprises light transmission holes that respectively overlap with the second-set openings.

2. The display device of claim 1, wherein light generated from the pixels is transmitted beyond the display device through the first-set openings, and
    wherein light incident into the display device is provided to the sensor layer through the second-set openings.

3. The display device of claim 1, wherein the light emitting element layer further comprises a bank layer positioned on the circuit element layer and surrounding the emitting layers.

4. The display device of claim 3, wherein the bank layer comprises:
    third-set openings respectively overlapping with the first-set openings; and
    fourth-set openings respectively overlapping with the second-set openings and respectively exposing portions of the insulating layer.

5. The display device of claim 4, wherein the third-set openings comprise a first third-set opening overlapping with the first first-set opening, a second third-set opening overlapping with the second first-set opening, a third third-set opening overlapping with the third first-set opening, and a fourth third-set opening overlapping with the fourth first-set opening, and
    wherein one of the fourth-set openings is positioned between the first third-set opening and the second third-set opening.

6. The display device of claim 3, wherein the bank layer overlaps the black matrix.

7. The display device of claim 3, wherein a material of the bank layer is identical to a material of the black matrix.

8. The display device of claim 1, wherein the light blocking layer blocks a first portion of light, and wherein the through holes transmit a second portion of the light toward the sensor layer.

9. The display device of claim 1, wherein the circuit element layer blocks a first portion of light, and wherein the light transmission holes transmit a second portion of the light toward the sensor layer.

10. The display device of claim 1, wherein the through holes respectively overlap with the light transmission holes.

11. The display device of claim 9, wherein the light is emitted from the pixels and then reflected by a finger of a user.

12. A display device comprising:
a sensor layer comprising photo sensors;
a substrate positioned on the sensor layer;
a pixel layer positioned on the substrate and comprising pixels, wherein the substrate is positioned between the sensor layer and the pixel layer, and wherein the pixels comprise pixel electrodes;
a black matrix positioned on the pixel layer, comprising first-set openings respectively overlapping with the pixel electrodes, and comprising second-set openings not overlapping with any pixel electrodes of the display device in a direction perpendicular to the substrate, wherein the pixel layer is positioned between the substrate and the black matrix; and
a color filter set positioned on the black matrix,
wherein the color filter set includes at least one color filter overlapping one of the first-set openings and one of the second-set openings,
wherein the pixels comprise a first pixel and a second pixel each emitting first color light, a third pixel emitting second color light, and a fourth pixel emitting third color light,
wherein the first-set openings comprise a first first-set opening overlapping with the first pixel, a second first-set opening overlapping with the second pixel, a third first-set opening overlapping with the third pixel, and a fourth first-set opening overlapping with the fourth pixel,
wherein at least two of the first first-set opening, the second first-set opening, the third first-set opening, and the fourth first-set opening are spaced from each other, and
wherein the first first-set opening and the second first-set opening are directly connected to one of the second-set openings.

13. A display device comprising:
a sensor layer comprising photo sensors;
a substrate positioned on the sensor layer;
a pixel layer positioned on the substrate and comprising pixels, wherein the substrate is positioned between the sensor layer and the pixel layer, and wherein the pixels comprise pixel electrodes;
a black matrix positioned on the pixel layer, comprising first-set openings respectively overlapping with the pixel electrodes, and comprising second-set openings not overlapping with any pixel electrodes of the display device in a direction perpendicular to the substrate, wherein the pixel layer is positioned between the substrate and the black matrix; and
a color filter set positioned on the black matrix,
wherein the color filter set includes at least one color filter overlapping one of the first-set openings and one of the second-set openings,
wherein the pixels comprise a first pixel and a second pixel each emitting first color light, a third pixel emitting second color light, and a fourth pixel emitting third color light,
wherein the first-set openings comprise a first first-set opening overlapping with the first pixel, a second first-set opening overlapping with the second pixel, a third first-set opening overlapping with the third pixel, and a fourth first-set opening overlapping with the fourth pixel,
wherein at least two of the first first-set opening, the second first-set opening, the third first-set opening, and the fourth first-set opening are spaced from each other, and
wherein the color filter set comprises a first color filter overlapping the first pixel and the second pixel, a second color filter overlapping the third pixel, and a third color filter overlapping the fourth pixel.

14. The display device of claim 13, wherein the first color filter includes a first region overlapping with the first first-set opening, a second region overlapping with the second first-set opening and a third region extending from the first region to the second region with overlapping one of the second-set openings.

15. A display device comprising:
a sensor layer comprising photo sensors;
a substrate positioned on the sensor layer;
a circuit element layer positioned on the substrate, comprising transistors, and comprising an insulating layer covering the transistors;
a light emitting element layer comprising emitting layers and a bank layer; and
a light blocking layer positioned between the substrate and the circuit element layer and comprising through holes,
wherein the emitting layers respectively correspond to the transistors, wherein the bank layer comprises first-set openings and second-set openings extending entirely through the bank layer in a direction perpendicular to the substrate, wherein the first-set openings respectively accommodate the emitting layers, and wherein the second-set openings accommodate no emitting layers,
wherein at least one of the through holes overlaps the second-set openings; and
wherein the circuit element layer comprises light transmission holes that respectively overlap with the second-set openings.

* * * * *